(12) United States Patent
Miyazaki et al.

(10) Patent No.: US 9,213,075 B2
(45) Date of Patent: *Dec. 15, 2015

(54) APPARATUS AND METHOD FOR MAGNETIC RESONANCE IMAGING

(71) Applicants: Kabushiki Kaisha Toshiba, Tokyo (JP); Toshiba Medical Systems Corporation, Otawara-shi, Tochigi (JP)

(72) Inventors: Mitsue Miyazaki, Des Plaines, IL (US); Hidenori Takeshima, Ebina (JP); Tsutomu Hoshino, Palm Harbor, FL (US); Satoshi Sugiura, Tochigi (JP)

(73) Assignees: KABUSHIKI KAISHA TOSHIBA, Tokyo (JP); TOSHIBA MEDICAL SYSTEMS CORPORATION, Tochigi (JP)

( * ) Notice: Subject to any disclaimer, the term of this patent is extended or adjusted under 35 U.S.C. 154(b) by 542 days.

This patent is subject to a terminal disclaimer.

(21) Appl. No.: 13/677,716

(22) Filed: Nov. 15, 2012

(65) Prior Publication Data
US 2013/0285655 A1    Oct. 31, 2013

(30) Foreign Application Priority Data

Apr. 27, 2012  (JP) ................................ 2012-103918
Sep. 13, 2012  (JP) ................................ 2012-201752

(51) Int. Cl.
*G01V 3/00*    (2006.01)
*G01R 33/54*   (2006.01)
(Continued)

(52) U.S. Cl.
CPC .............. *G01R 33/543* (2013.01); *G01R 33/34* (2013.01); *G01R 33/5608* (2013.01);
(Continued)

(58) Field of Classification Search
CPC ...................................................... G01R 33/543
USPC .......................................................... 324/309
See application file for complete search history.

(56) References Cited

U.S. PATENT DOCUMENTS 6,801,800 B2   10/2004   Miyazaki et al.
7,688,068 B2    3/2010   Beatty
(Continued)

FOREIGN PATENT DOCUMENTS

JP    2008-307357    12/2008

OTHER PUBLICATIONS

Pruessmann, K. P. et al., "Sense: Sensitivity Encoding for Fast MRI", Magnetic Resonance in Medicine, vol. 42, (1999), pp. 952-962.
(Continued)

*Primary Examiner* — Rodney Fuller
(74) *Attorney, Agent, or Firm* — Nixon & Vanderhye P.C.

(57) ABSTRACT

A magnetic resonance imaging apparatus includes: a sequence controlling unit that, by controlling an execution of a pulse sequence, acquires magnetic resonance (MR) signals corresponding to a plurality of channels in the pulse sequence executed as a series, the MR signals being configured to be arranged into a first region of a k-space at first intervals and into a second region larger than the first region at second intervals larger than the first intervals; an arranging unit that arranges the MR signals corresponding to the channels into the k-space as k-space data; and an image generating unit that generates first-interval k-space data corresponding to the channels based on the second-interval k-space data acquired by executing the pulse sequence and generates a magnetic resonance image based on the generated first-interval k-space data, the first-interval k-space data acquired by executing the pulse sequence, and sensitivity distributions corresponding to the channels.

20 Claims, 24 Drawing Sheets

(51) Int. Cl.
    *G01R 33/34*           (2006.01)
    *G01R 33/56*           (2006.01)
    *G01R 33/561*          (2006.01)
    *G01R 33/563*          (2006.01)
    *G01R 33/567*          (2006.01)

(52) U.S. Cl.
    CPC ....... *G01R 33/5611* (2013.01); *G01R 33/5614* (2013.01); *G01R 33/5673* (2013.01); *G01R 33/56325* (2013.01); *G01R 33/56341* (2013.01)

(56) References Cited

U.S. PATENT DOCUMENTS

| | | | |
|---|---|---|---|
| 7,746,070 B2 | 6/2010 | Park et al. | |
| 8,577,443 B2 * | 11/2013 | Miyazaki | 600/413 |
| 2006/0208731 A1 * | 9/2006 | Wang et al. | 324/309 |
| 2008/0161678 A1 | 7/2008 | Miyazaki et al. | |
| 2010/0039110 A1 * | 2/2010 | Takahashi et al. | 324/310 |
| 2010/0171496 A1 | 7/2010 | Park et al. | |
| 2011/0080170 A1 | 4/2011 | Miyazaki | |
| 2011/0156704 A1 * | 6/2011 | Boernert et al. | 324/309 |
| 2012/0095327 A1 | 4/2012 | Miyazaki | |
| 2013/0285662 A1 * | 10/2013 | Takeshima | 324/318 |
| 2015/0028872 A1 * | 1/2015 | Takeshima | 324/318 |

OTHER PUBLICATIONS

Griswold, M.A. et al., Generalized Autocalibrating Partially Parallel Acquisitions (GRAPPA), Magnetic Resonance in Medicine, vol. 47, (2002), pp. 1202-1210.

Tsao, J. et al., "Unifying Linear Prior-Information-Driven Methods for Accelerated Image Acquisition", Magnetic Resonance in Medicine, vol. 46, (2001), pp. 652-660.

Tsao, J. et al., "k-t Blast and k-t Sense: Dynamic MRI with High Frame Rate Exploiting Spatiotemporal Correlations", Magnetic Resonance in Medicine, vol. 50, (2003), pp. 1031-1042.

Pruessmann, K.P. et al., "Advances in Sensitivity Encoding with Arbitrary k-Space Trajectories", Magnetic Resonance in Medicine, vol. 46, (2001), pp. 638-651.

* cited by examiner

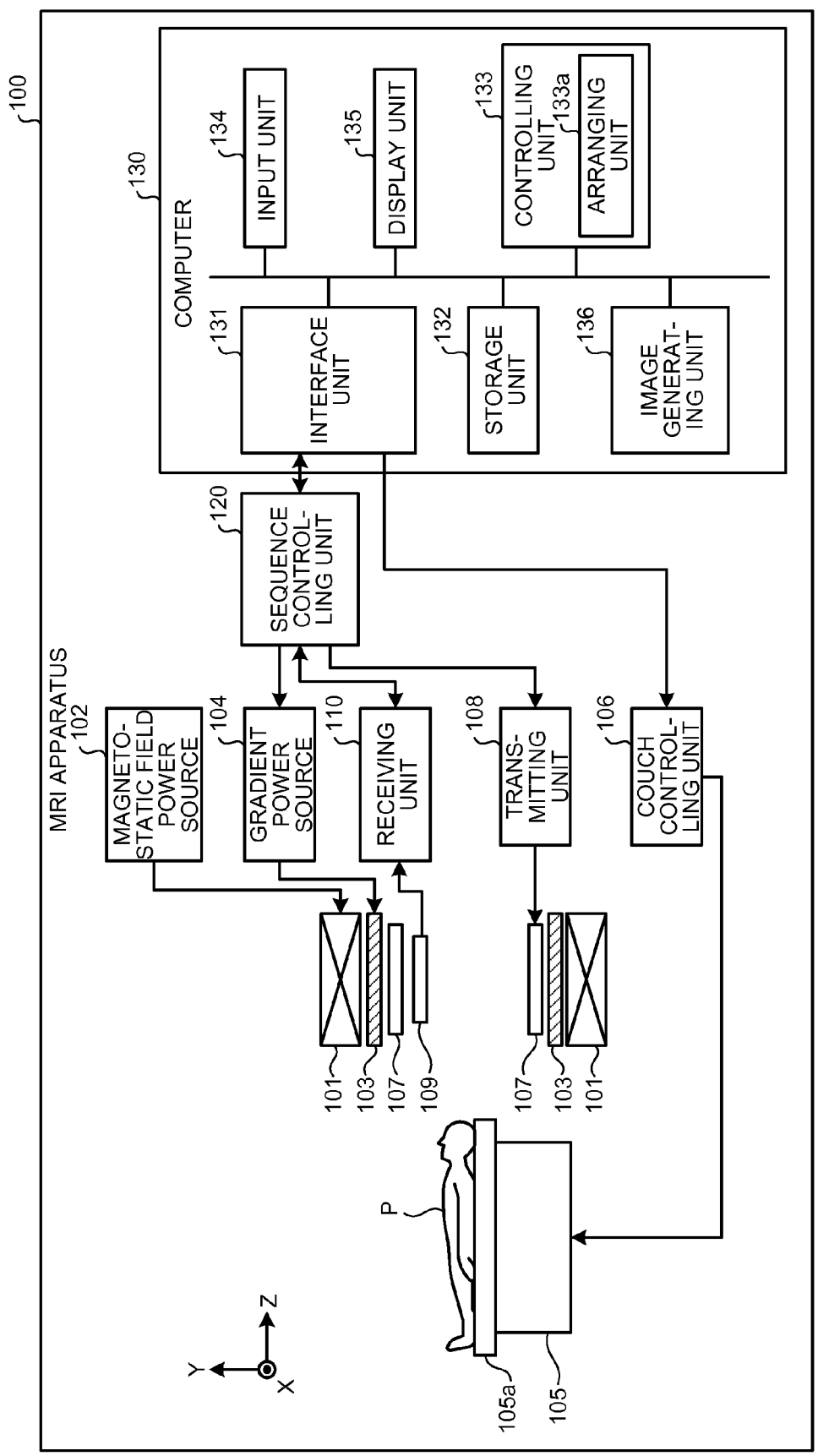

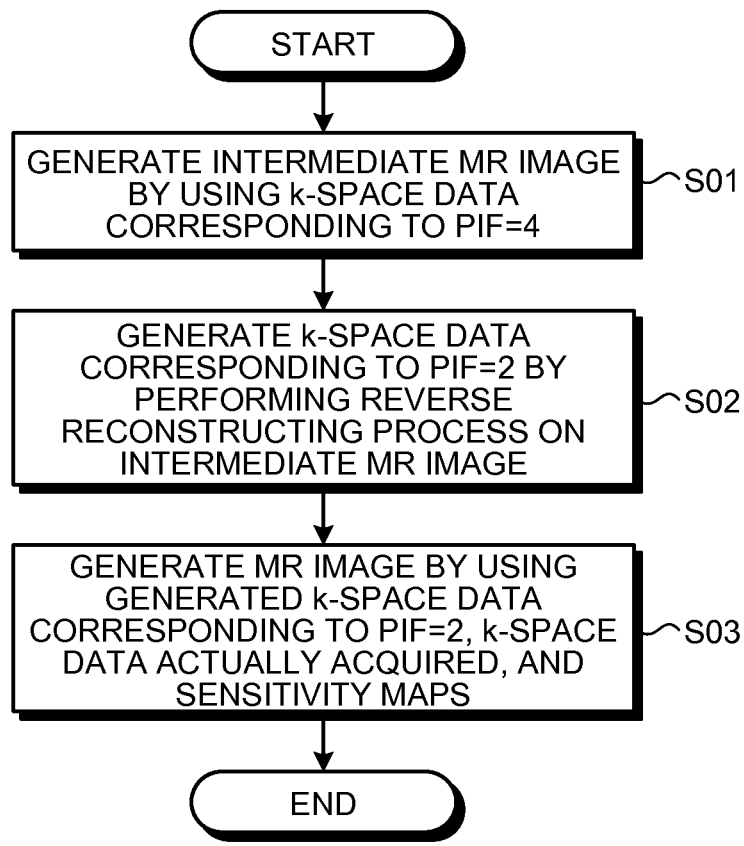

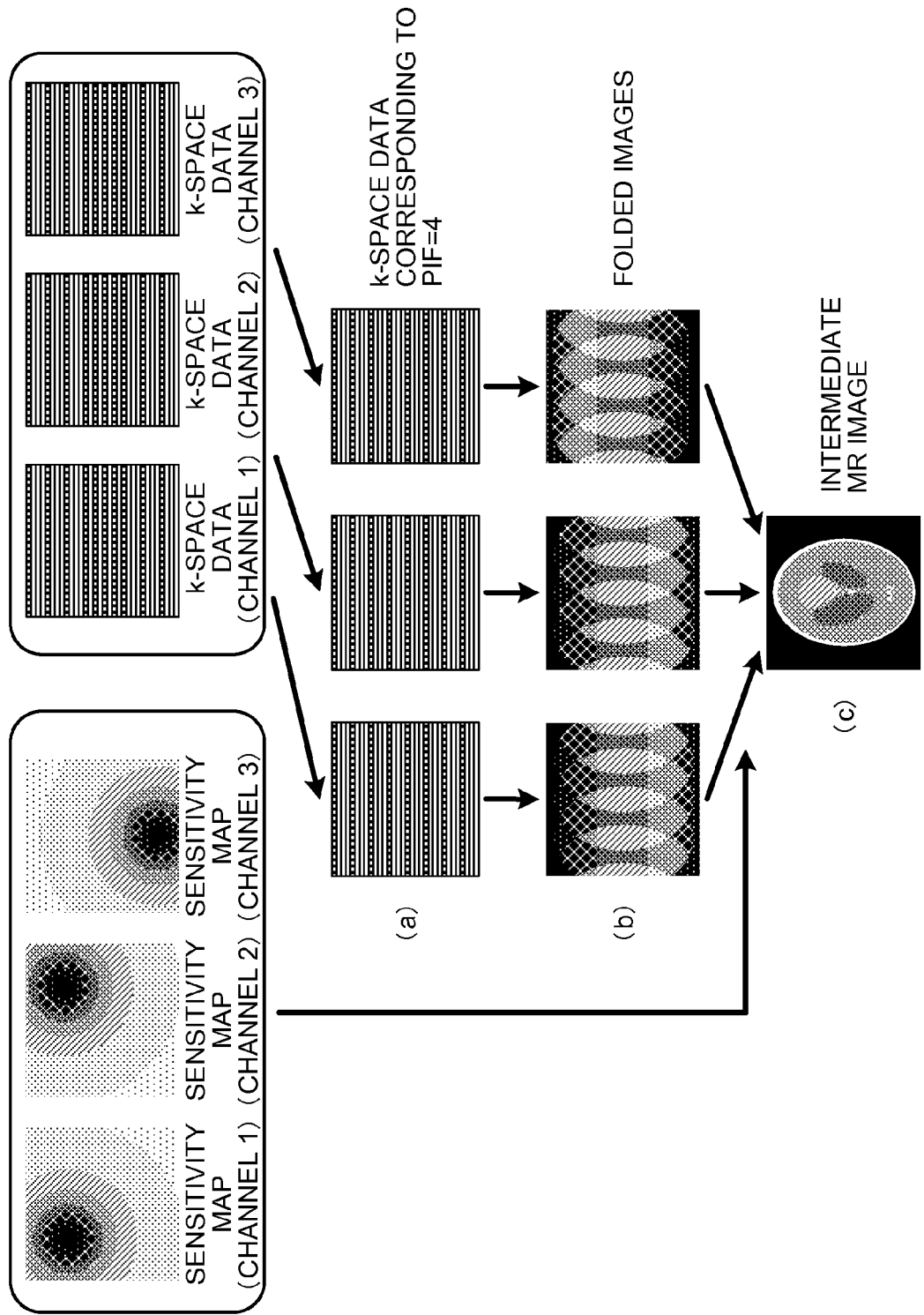

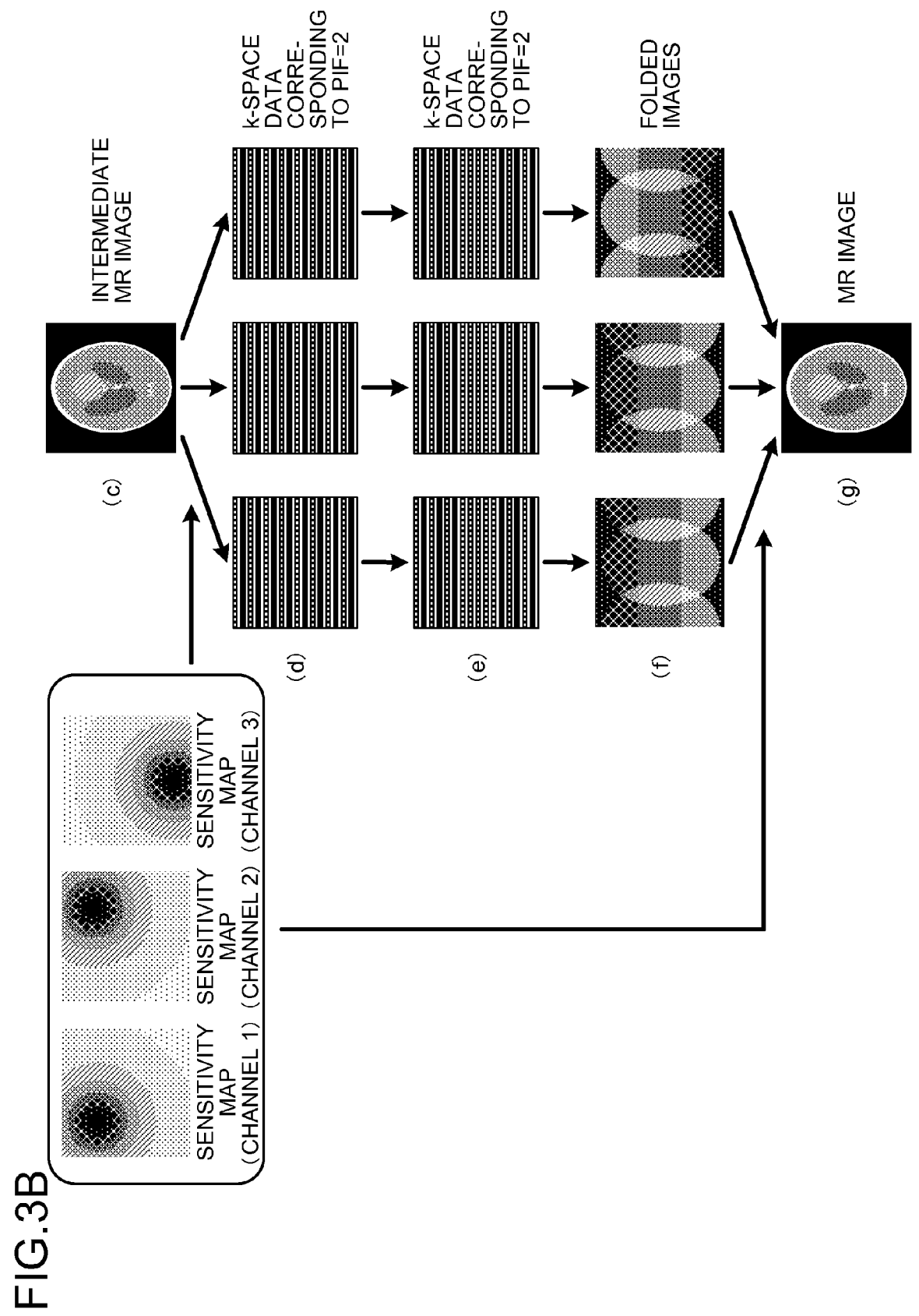

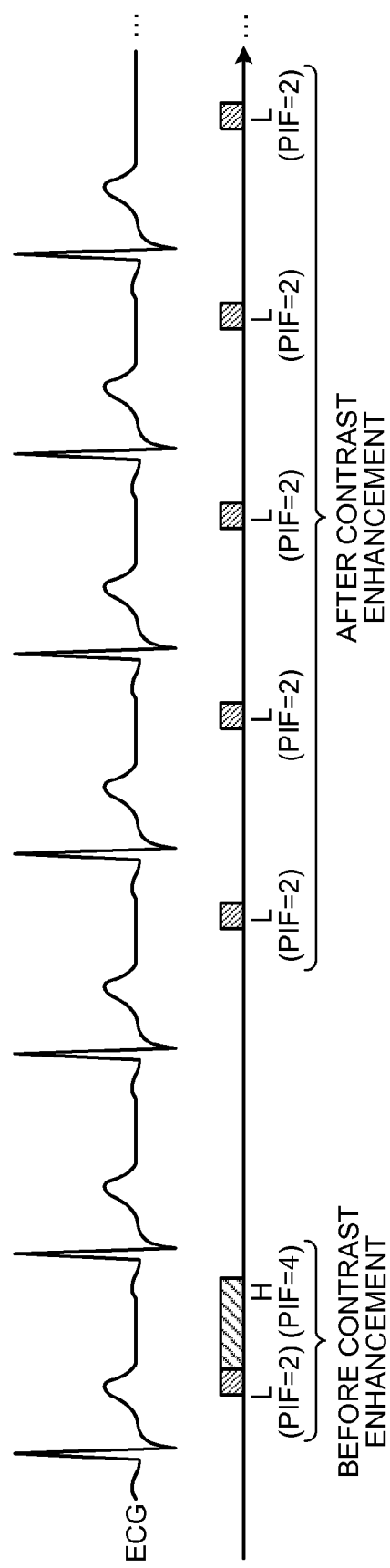

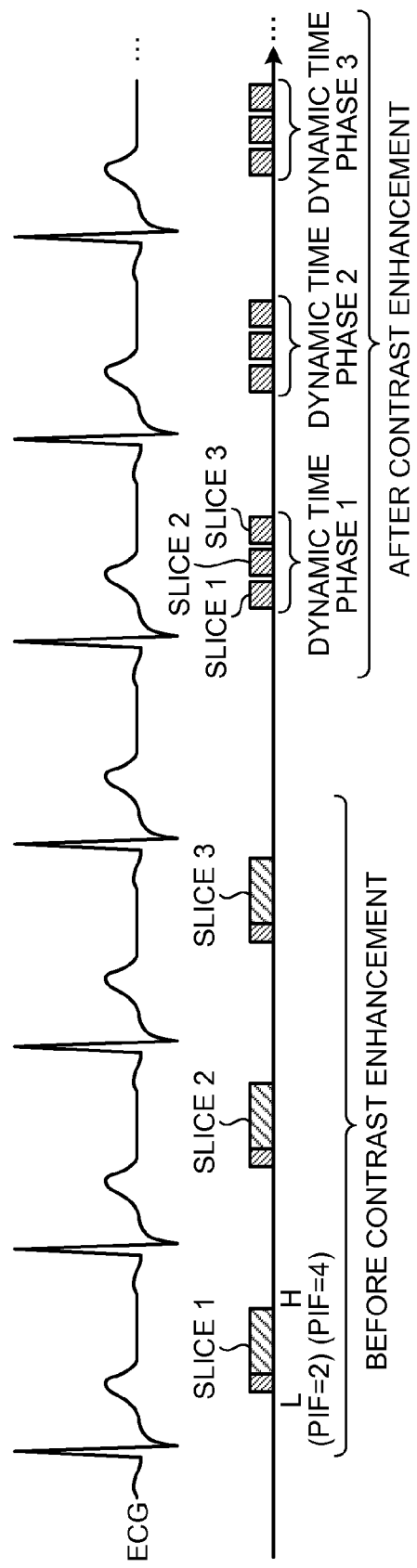

APPARATUS AND METHOD FOR MAGNETIC RESONANCE IMAGING

CROSS-REFERENCE TO RELATED APPLICATIONS

This application is based upon and claims the benefit of priority from Japanese Patent Application No. 2012-103918, filed on Apr. 27, 2012; and Japanese Patent Application No. 2012-201752, filed on Sep. 13, 2012; the entire contents of which are incorporated herein by reference.

FIELD

Embodiments described herein relate generally to an apparatus and a method for magnetic resonance imaging.

BACKGROUND

Magnetic resonance imaging is an image taking method by which a nuclear spin in an examined subject placed in a magnetostatic field is magnetically excited by a Radio Frequency (RF) pulse at a Larmor frequency thereof so as to generate an image from magnetic resonance signals (hereinafter, "MR signals" as necessary) generated due to the excitation.

Conventionally, a parallel imaging (PI) method is known as one of high-speed image taking methods. Generally speaking, when the PI method is implemented, an effort is made to shorten the time period required by the image taking process (hereinafter, "image taking period"), by acquiring k-space data while performing a down-sampling (thinning) process thereon. Because a folded image is generated from the k-space data acquired while performing the down-sampling process, an image that is not folded is obtained by, according to the PI method, performing, on pieces of k-space data acquired in correspondence with a plurality of channels at different sensitivities, a reconstructing process using a difference in sensitivity between the channels. However, when the thinned-out ratio (hereinafter, the "Parallel Imaging Factor (PIF)", as necessary) is increased, the Signal-to-Noise Ratio (SNR) drops. Thus, there is a certain limit to high-speed image taking processes. Also, because the PIF has a limit, there is also a certain limit to improvements on time resolutions.

BRIEF DESCRIPTION OF THE DRAWINGS

FIG. 1 is a functional block diagram depicting a configuration of a Magnetic Resonance Imaging (MRI) apparatus according to a first embodiment;

FIG. 2 is a drawing for explaining an image generating method according to the first embodiment;

FIG. 3A is another drawing for explaining the image generating method according to the first embodiment;

FIG. 3B is yet another drawing for explaining the image generating method according to the first embodiment;

FIG. 26 is a drawing for explaining an imaging scan according to a second modification example of the sixth embodiment; and FIG. 27 is a drawing for explaining an imaging scan according to a third modification example of the sixth embodiment.

DETAILED DESCRIPTION

Figure 4:
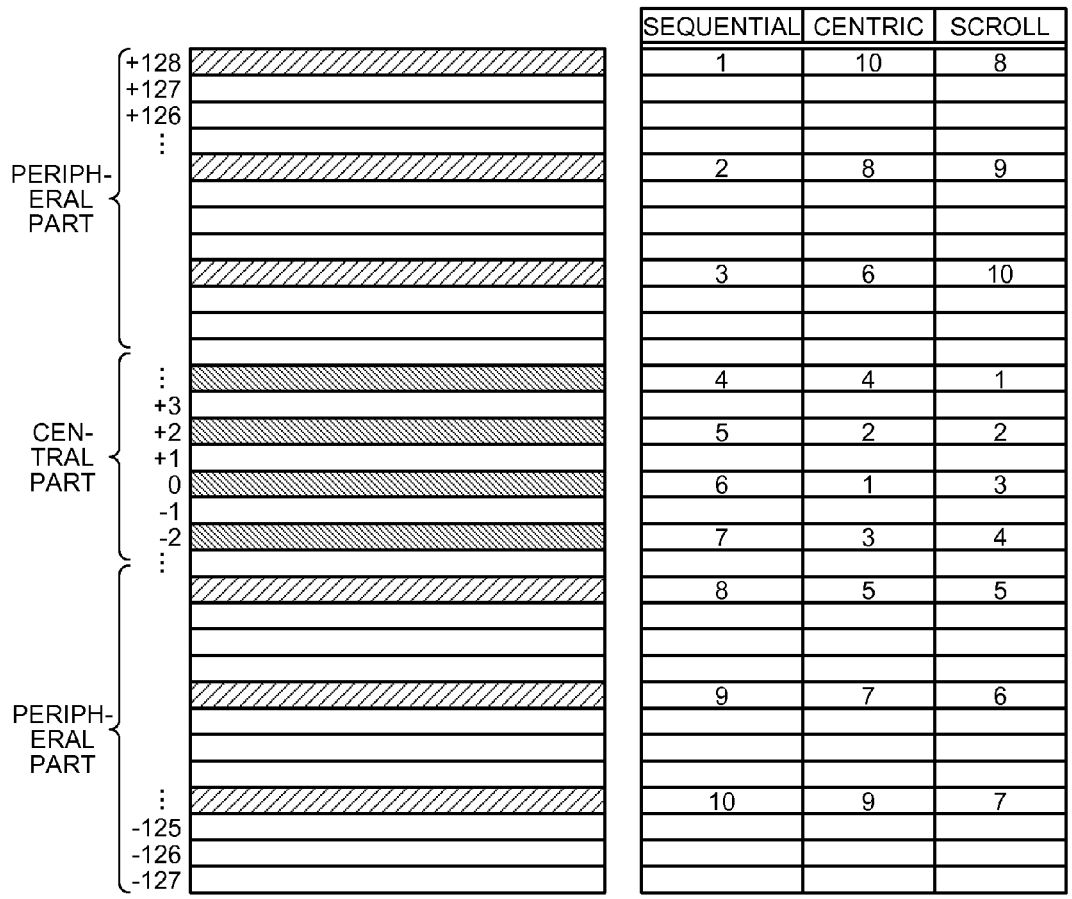
FIG. 4 is a drawing for explaining a phase encoding pattern according to the first embodiment.

A magnetic resonance imaging apparatus according to an embodiment includes a sequence controlling unit, an arranging unit, and an image generating unit. The sequence controlling unit is configured to, by controlling an execution of a pulse sequence, acquire magnetic resonance signals corresponding to a plurality of channels in the pulse sequence executed as a series, the magnetic resonance signals being configured to be arranged into a first region of a k-space so as to be positioned at first intervals and into a second region larger than the first region so as to be positioned at second intervals larger than the first intervals. The arranging unit is configured to arrange the magnetic resonance signals corresponding to the plurality of channels into the k-space as k-space data. The image generating unit is configured to generate k-space data at the first intervals corresponding to the plurality of channels based on the k-space data at the second intervals acquired by the execution of the pulse sequence and generate a magnetic resonance image based on the generated k-space data at the first intervals, the k-space data at the first intervals acquired by the execution of the pulse sequence, and sensitivity distributions corresponding to the plurality of channels.

In the following sections, exemplary embodiments of an apparatus and a method for magnetic resonance imaging will be explained, with reference to the accompanying drawings. Possible embodiments are not limited to the exemplary embodiments described herein.

First Embodiment

FIG. 1 is a functional block diagram depicting a configuration of an MRI apparatus 100 according to a first embodiment. As shown in FIG. 1, the MRI apparatus 100 includes a magnetostatic field magnet 101, a magnetostatic field power source 102, a gradient coil 103, a gradient power source 104, a couch 105, a couch controlling unit 106, a transmission coil 107, a transmitting unit 108, a reception coil array 109, a receiving unit 110, a sequence controlling unit 120, and a computer 130. An examined subject (hereinafter, "subject") P (e.g., a human body) is not included in the MRI apparatus 100. The configuration shown in FIG. 1 is merely an example. For instance, the functional units included in the sequence controlling unit 120 and the computer 130 may be configured as being integrated together or separated, as necessary.

The magnetostatic field magnet 101 is a magnet formed in the shape of a hollow circular cylinder and generates a magnetostatic field in the space on the inside thereof. The magnetostatic field magnet 101 may be configured by using, for example, a superconductive magnet. The magnetostatic field magnet 101 is configured to be excited by receiving a supply of electric current from the magnetostatic field power source 102. The magnetostatic field power source 102 supplies the electric current to the magnetostatic field magnet 101. Alternatively, the magnetostatic field magnet 101 may be configured by using a permanent magnet. In that situation, the MRI apparatus 100 does not necessarily have to include the magnetostatic field power source 102. It is also acceptable to provide the magnetostatic field power source 102 separately from the MRI apparatus 100.

The gradient coil 103 is a coil formed in the shape of a hollow circular cylinder and is disposed on the inside of the magnetostatic field magnet 101. The gradient coil 103 is formed by combining three coils corresponding to X-, Y-, and Z-axes that are orthogonal to one another. These three coils individually receive a supply of electric current from the gradient power source 104 and generate gradient magnetic fields of which the magnetic field intensities change along the X-, Y-, and Z-axes. The gradient magnetic fields on the X-, Y-, and Z-axes that are generated by the gradient coil 103 are, for example, a slice encoding gradient magnetic field $G_{SE}$ (or a slice selecting gradient magnetic field $G_{SS}$), a phase encoding gradient magnetic field $G_{PE}$, and a frequency encoding gradient magnetic field $G_{RO}$, respectively. The gradient power source 104 supplies electric current to the gradient coil 103.

The couch 105 includes a couchtop 105a on which the subject P is placed. Under control of the couch controlling unit 106, while the subject P is placed thereon, the couchtop 105a is inserted into the hollow (i.e., an image taking opening) of the gradient coil 103. Normally, the couch 105 is provided so that the longitudinal direction thereof extends parallel to the central axis of the magnetostatic field magnet 101. Under control of the computer 130, the couch controlling unit 106 drives the couch 105 so that the couchtop 105a moves in the longitudinal direction and in an up-and-down direction.

The transmission coil 107 is disposed on the inside of the gradient coil 103 and generates a radio-frequency magnetic field by receiving a supply of a Radio Frequency (RF) pulse from the transmitting unit 108. The transmitting unit 108 supplies the RF pulse corresponding to a Larmor frequency, which is determined by the type of a target atom and the intensity of the magnetic field, to the transmission coil 107.

The reception coil array 109 is disposed on the inside of the gradient coil 103 and receives Magnetic Resonance (MR) signals emitted from the subject P due to an influence of the radio-frequency magnetic field. When having received the MR signals, the reception coil array 109 outputs the received MR signals to the receiving unit 110. In the first embodiment, the reception coil array 109 is configured to include one or more coil elements, and typically a plurality of coil elements.

The transmission coil 107 and the reception coil array 109 described above are merely examples. It is acceptable to use one or more in combination selected from among a coil having only a transmitting function, a coil having only a receiving function, and a coil having a transmitting and receiving function.

The receiving unit 110 detects the MR signals being output from the reception coil array 109 and generates MR data based on the detected MR signals. More specifically, the receiving unit 110 generates the MR data by applying a digital conversion to the MR signals being output from the reception coil array 109. Further, the receiving unit 110 transmits the generated MR data to the sequence controlling unit 120. The receiving unit 110 may be provided on a gantry device side where the magnetostatic field magnet 101, the gradient coil 103, and like are provided.

In the first embodiment, the MR signals output from the coil elements included in the reception coil array 109 are divided and/or combined as appropriate, before being output to the receiving unit 110 in units called "channels", for example. Thus, the MR data is handled in units of channels in the processes performed by the receiving unit 110 and at the stages subsequent thereto. As for the relationship between the total quantity of coil elements and the total quantity of channels, the two quantities may be equal, or the total quantity of channels may be smaller than the total quantity of coil elements, or conversely, the total quantity of channels may be larger than the total quantity of coil elements. In the following explanation, the expressions "each channel" and "each of the channels" indicate that the process may be performed in correspondence with each of the coil elements or may be performed in correspondence with each of the channels that are obtained by dividing and/or combining the coil elements. Further, the timing with which the coil elements are divided and/or combined is not limited to the example stated above. Any timing is acceptable as long as the MR signals or the MR data is divided and/or combined in units of channels prior to the process performed by a controlling unit 133 (explained later).

The sequence controlling unit 120 performs an image taking process on the subject P, by driving the gradient power source 104, the transmitting unit 108, and the receiving unit 110, based on sequence information transmitted from the computer 130. In this situation, the sequence information is information that defines a procedure for performing the image taking process. The sequence information defines, for example, the intensity of the electric current to be supplied by the gradient power source 104 to the gradient coil 103 and the timing with which the electric current is to be supplied; the strength of the RF pulse to be supplied by the transmitting unit 108 to the transmission coil 107 and the timing with which the RF pulse is to be applied; and the timing with which the MR signals are to be detected by the receiving unit 110. The sequence controlling unit 120 is configured by using, for example, an integrated circuit such as an Application Specific Integrated Circuit (ASIC) or a Field Programmable Gate Array (FPGA), or an electronic circuit such as a Central Processing Unit (CPU) or a Micro Processing Unit (MPU).

When the sequence controlling unit 120 has received the MR data from the receiving unit 110, as a result of driving the gradient power source 104, the transmitting unit 108, and the receiving unit 110 and taking the image of the subject P, the sequence controlling unit 120 transfers the received MR data to the computer 130.

The computer 130 exercises overall control of the MRI apparatus 100 and generates an MR image, for example. The computer 130 includes an interface unit 131, a storage unit 132, the controlling unit 133, an input unit 134, a display unit 135, and an image generating unit 136. Further, the controlling unit 133 includes an arranging unit 133a.

The interface unit 131 transmits the sequence information to the sequence controlling unit 120 and receives the MR data from the sequence controlling unit 120. When having received the MR data, the interface unit 131 stores the received MR data into the storage unit 132. The MR data stored in the storage unit 132 is arranged into a k-space by the arranging unit 133a. As a result, the storage unit 132 stores therein k-space data corresponding to a plurality of channels.

The storage unit 132 stores therein, for example, the MR data received by the interface unit 131, the k-space data arranged in the k-space by the arranging unit 133a, and image data generated by the image generating unit 136. For example, the storage unit 132 is configured by using a semiconductor memory element such as a Random Access Memory (RAM) or a flash memory, a hard disk, an optical disk, or the like.

The input unit 134 receives various types of instructions and inputs of information from an operator. The input unit 134 is configured by using a pointing device such as a mouse or a trackball, a selecting device such as a mode changing switch, and/or an input device such as a keyboard. Under control of the controlling unit 133, the display unit 135 displays various types of information such as spectrum data and the image data. The display unit 135 is configured by using, for example, a display device such as a liquid crystal display device.

The controlling unit 133 exercises overall control of the MRI apparatus 100. More specifically, the controlling unit 133 controls the image taking process by generating the sequence information based on an image taking condition input from the operator via the input unit 134 and transmitting the generated sequence information to the sequence controlling unit 120. Further, the controlling unit 133 controls the image generating process performed based on the MR data and controls the display process realized by the display unit 135. Further, the arranging unit 133a reads the MR data generated by the receiving unit 110 from the storage unit 132 and arranges the read MR data into the k-space. For example, the controlling unit 133 is configured by using an integrated circuit such as an ASIC or an FPGA, or an electronic circuit such as a CPU or an MPU.

The image generating unit 136 reads the k-space data arranged in the k-space by the arranging unit 133a from the storage unit 132 and generates the MR image by applying a reconstructing process such as a Fourier transform to the read k-space data.

Next, a flow in an entire image taking process performed by the MRI apparatus 100 described above will be explained briefly. To perform a medical examination, for example, the MRI apparatus 100 performs preparatory scans, prior to an imaging scan performed to acquire the k-space data used for generating a diagnosis image. Examples of the preparatory scans include: a scan performed to acquire profile data indicating sensitivities in orientation directions of the channels; a scan performed to acquire a position determining image; a scan performed to acquire a sensitivity map indicating a sensitivity distribution of each of the channels; a scan performed to acquire spectrum data used for obtaining a center frequency of the RF pulse; a scan performed to obtain an electric current value caused to flow into a correction coil (not shown) for the purpose of adjusting uniformity of the magnetostatic field. Any of these scans may be selected and performed as necessary. Further, as explained in the second and later embodiments, a scan to obtain an image taking parameter to be used in an imaging scan may be performed as a preparatory scan.

After the preparatory scans have been performed, an imaging scan is performed to acquire the k-space data used for generating the diagnosis image. Further, by using the k-space data stored in the storage unit 132, the MRI apparatus 100 generates the MR image. As explained later, the image generating unit 136 according to the first embodiment generates the MR image by using the sensitivity maps acquired by performing the preparatory scan and the k-space data acquired by performing the imaging scan. It should be noted that the sensitivity maps do not necessarily have to be acquired prior to the imaging scan, as long as the sensitivity maps are acquired prior to the image generating process.

Next, an image generating method will be explained, with reference to FIGS. 2, 3A, and 3B. FIGS. 2, 3A, and 3B are drawings for explaining an image generating method according to the first embodiment. The image generating method according to the first embodiment may be applied to any embodiment other than the first embodiment. Further, the explanation of the k-space data in the following sections may similarly be applied to any embodiment other than the first embodiment.

First, the k-space data serving as a target of the image generating process according to the first embodiment will be explained. In the first embodiment, as a result of the sequence controlling unit 120 controlling the execution of a pulse sequence while implementing the PI method, k-space data corresponding to a plurality of channels is acquired. The k-space data is to be arranged into a first region of the k-space so as to be positioned at first intervals and into a second region larger than the first region so as to be positioned at second intervals that are larger than the first intervals. The k-space may be two-dimensional, three-dimensional, or of any other dimension.

In the first embodiment, an example will be explained in which the k-space data is arranged in a central part of the k-space having a size of 256×256 (or 256×256×256) while satisfying (corresponding to) PIF=2 and is arranged in the entire region including a peripheral part while satisfying PIF=4; however, this configuration is merely an example. For instance, it is acceptable to use other k-space data as the target, such as k-space data arranged while satisfying other PIFs, k-space data arranged while satisfying three or more types of PIFs, k-space data in which a part of the k-space is zero filled (zero padding). Further, in the first embodiment, a pattern will be explained in which a down-sampling process is performed only in the phase encoding direction, whereas no down-sampling process is performed in the frequency encoding direction and the slice encoding directions. However, the exemplary embodiments are not limited to this example. For example, it is acceptable to modify the pattern as necessary by, for example, performing down-sampling processes in both the phase encoding direction and the slice encoding direction. Further, in the first embodiment, the PIFs are set in such a manner that the second intervals are each an integer multiple of the first intervals; however, the exemplary embodiments are not limited to this example. The relationship between the two interval values does not necessarily have to be that of an integer multiple. It is also acceptable to use values other than integers as the PIFs. Furthermore, the exemplary embodiments are not necessarily limited by the relationship where the intervals at the central part (a low frequency region) are smaller than the intervals in the peripheral part (a high frequency region).

On the assumption that the k-space data is configured as described above, an overall flow of the image generating process will be briefly explained first. As shown in FIG. 2, the image generating unit 136 generates an intermediate MR image by using k-space data that is among the k-space data stored in the storage unit 132, corresponds to the plurality of channels, and is arranged in the entire region including the peripheral part while satisfying PIF=4 (step S01). To distinguish this MR image from an MR image serving as a final output, the MR image generated at step S01 will be referred to as the "intermediate MR image".

Subsequently, the image generating unit 136 generates k-space data that corresponds to the plurality of channels and is arranged in the entire region including the peripheral part while satisfying PIF=2, by performing a reverse reconstructing process on the intermediate MR image generated at step S01 (step S02). Further, the image generating unit 136 generates the MR image serving as the final output, based on the k-space data generated at step S02 satisfying PIF=2, the k-space data actually acquired, and the sensitivity maps corresponding to the plurality of channels (step S03). The image generating unit 136 may perform image processing, such as Maximum Intensity Projection (MIP) or Multi Planer Reconstruction (MPR), on the MR image serving as the final output.

Next, the image generating process described above will be explained more in detail, with reference to FIGS. 3A and 3B. The description of FIGS. 3A and 3B is based on the assumption that "the plurality of channels" are three channels; however, the exemplary embodiments are not limited to this example. The number of channels may be any arbitrary value. Further, although a two-dimensional k-space is used as an example in the description of FIGS. 3A and 3B for the sake of convenience in the explanation, the same explanation is similarly applicable to a three-dimensional k-space.

Further, in FIGS. 3A and 3B, the sensitivity maps corresponding to the plurality of channels have been acquired by performing the preparatory scans or the like under the control of the sequence controlling unit 120. Further, in FIGS. 3A and 3B, the k-space data corresponding to the plurality of channels has been acquired by performing an image scan and arranged in the k-space by the arranging unit 133a, under the control of the sequence controlling unit 120. In other words, the k-space data is such k-space data that is arranged in the central part of the k-space having a size of 256×256 (or 256×256×256) while satisfying PIF=2 and is arranged in the entire region including the peripheral part while satisfying PIF=4.

As shown in FIG. 3A (a), the image generating unit 136 reads k-space data that is among the k-space data corresponding to the plurality of channels stored in the storage unit 132, corresponds to the plurality of channels, and is arranged in the entire region including the peripheral part while satisfying PIF=4, as a processing target. After that, as shown in FIG. 3A (b), the image generating unit 136 generates folded images corresponding to the plurality of channels, by performing a reconstructing process on the k-space data satisfying PIF=4 in correspondence with each of the channels. Subsequently, as shown in FIG. 3A (c), the image generating unit 136 generates an intermediate MR image by applying the sensitivity maps corresponding to the channels respectively to the folded images corresponding to the channels, so as to perform the unfolding process according to the PI method.

After that, as shown in FIG. 3B (d), the image generating unit 136 generates (second) intermediate MR images corresponding to the plurality of channels and reflecting the sensitivities of the channels, by applying each of the sensitivity maps of the channels to the generated intermediate MR image. After that, the image generating unit 136 generates pieces of k-space data corresponding to the plurality of channels by performing a reverse reconstructing process on each of the generated (second) intermediate MR images. For example, the image generating unit 136 generates the (second) intermediate MR images that are weighted and correspond to the plurality of channels, by applying the sensitivity maps corresponding to the channels to each of the pixels within the intermediate MR image shown in FIG. 3B (c). Because the (second) intermediate MR images are images that are not folded, the image generating unit 136 performs a folding process. (The image generating unit 136 performs a weighted addition, according to a weight that is determined depending on the phase of a position in which the data is arranged in the k-space. The weight can be found out from a transform formula of a discrete Fourier transform.) After that, the image generating unit 136 generates pieces of k-space data that correspond to the plurality of channels and are arranged in the entire region including the peripheral part while satisfying PIF=2, by performing a down-sampling process on each of the pieces of k-space data corresponding to the channels.

Subsequently, as shown in FIG. 3B (e), the image generating unit 136 generates pieces of k-space data satisfying PIF=2 that correspond to the plurality of channels and are arranged in the entire region including the peripheral part, by combining the generated pieces of k-space data satisfying PIF=2 and the k-space data actually acquired. To combine the data, it is acceptable to perform an overwriting process using the k-space data actually acquired. Alternatively, it is also acceptable to apply weights to the two pieces of data. After that, as shown in FIG. 3B (f), the image generating unit 136 generates folded images corresponding to the plurality of channels by performing a reconstructing process on each of the pieces of k-space data corresponding to the plurality of channels and satisfying PIF=2. Subsequently, as shown in FIG. 3B (g), the image generating unit 136 generates the MR image serving as the final output, by applying the sensitivity maps corresponding to the channels respectively to the folded images corresponding to the channels, so as to perform the unfolding process according to the PI method.

In the explanation using FIGS. 2, 3A, and 3B, the example is explained in which the k-space data arranged while satisfying the two types of PIFs is used as the processing target; however, the exemplary embodiments are not limited to this example. The exemplary embodiments are also applicable to a situation where the processing target is k-space data arranged while satisfying three or more types of PIFs. In that situation, for example, the image generating unit 136 may sequentially repeat the process described above.

Further, in the explanation using FIGS. 2, 3A, and 3B, the example is explained in which a SENSE (sensitivity encoding)-based technique is applied as the PI method implemented for generating the images. However, the exemplary embodiments are not limited to this example. For instance, the exemplary embodiments are also applicable to a situation where a SMASH (simultaneous acquisition of spatial harmonics)-based technique (e.g., GRAPPA (generalized autocalibrating partially parallel acquisition)) is applied or to a situation where a GRAPPA method and a SENSE method are combined together. Alternatively, for example, SENSE-based technique (K. P. Pruessmann et al., Magnetic Resonance in Medicine 46: 638-651, 2001) corresponding to any arbitrary sampling pattern may be applied.

For example, when applying a GRAPPA method, the sequence controlling unit 120 acquires k-space data in the central part without performing a down-sampling process, as a sensitivity map corresponding to each of the plurality of channels. Further, based on the k-space data satisfying PIF=2, the image generating unit 136 first calculates an interpolation coefficient used for interpolating the k-space data satisfying PIF=4, with PIF=2. After that, the image generating unit 136 estimates the k-space data that is thinned out and satisfies PIF=2, by applying the calculated interpolation coefficient to the k-space data corresponding to each of the channels and satisfying PIF=4. Further, based on the sensitivity maps, the image generating unit 136 calculates an interpolation coefficient used for interpolating the k-space data satisfying PIF=2. After that, the image generating unit 136 estimates the rest of the k-space data, by applying the calculated interpolation coefficient to the k-space data corresponding to each of the channels and satisfying PIF=2 that has been obtained by combining the estimated k-space data with the k-space data actually acquired. Thus, the image generating unit 136 generates the MR image by performing the reconstructing process while using the k-space data in which all the lines are filled.

In another example, when implementing a GRAPPA method and a SENSE method combined together, based on the k-space data satisfying PIF=2, the image generating unit 136 calculates an interpolation coefficient used for interpolating the k-space data satisfying PIF=4, with PIF=2. Subsequently, the image generating unit 136 estimates the k-space data that is thinned out and satisfies PIF=2, by applying the calculated interpolation coefficient to the k-space data corresponding to each of the channels and satisfying PIF=4. After that, in the same manner as when applying the sense-based technique (i.e., performing the same processes as shown in FIG. 3B (e) and thereafter), the image generating unit 136 generates k-space data corresponding to the plurality of channels and satisfying PIF=2, by combining the generated k-space data satisfying PIF=2 with the k-space data actually acquired. Subsequently, the image generating unit 136 generates folded images corresponding to the plurality of channels, by performing the reconstructing process on each of the pieces of k-space data corresponding to the channels and satisfying PIF=2. After that, the image generating unit 136 generates an MR image by applying the sensitivity maps corresponding to the channels respectively to the folded images corresponding to the channels, so as to perform the unfolding process according to the PI method.

The SNR of the MR image generated in this manner is improved compared to an MR image generated from k-space data arranged in the entire region of the k-space while satisfying PIF=4.

Next, phase encoding patterns according to first embodiment will be explained, with reference to FIGS. 4 to 11. FIGS. 4 to 11 are drawings for explaining the phase encoding patterns according to the first embodiment. The phase encoding patterns explained herein may be selected and applied, as necessary, to any of the second and later embodiments. Further, embodiments of the phase encoding patterns are not limited to the patterns explained below. A phase encoding pattern explained in the second and later embodiments or any other pattern may be applied. Furthermore, the sequence controlling unit 120 does not necessarily have to control the execution of all the phase encoding patterns explained below. The sequence controlling unit 120 may control the execution of a part thereof. The descriptions given below for the phase encoding patterns may be applied to, for example, slice encoding patterns serving as alternatives.

Further, the patterns are not dependent on the type of a pulse sequence. The types of pulse sequences can be roughly categorized into a group called "Spin Echo (SE)-based" that uses an RF pulse for refocusing and a group called "Field Echo (FE)-based" that uses a gradient magnetic field for refocusing. The patterns are applicable to both of these groups. Examples of the SE-based pulse sequences include Fast SE (FSE) and Fast Asymmetric SE (FASE). Examples of the FE-based pulse sequences include Fast FE (FFE) and balanced Steady-State Free Precession (bSSFP). It should be noted that bSSFP may sometimes be regarded as a different system from the SE-based and the FE-based pulse sequences. Another example of a type of pulse sequences is Echo Planar Imaging (EPI). Further, the patterns are applicable to both an acquisition of two-dimensional data and an acquisition of three-dimensional data.

The MR signals acquired under the control of the sequence controlling unit 120 become the k-space data only after being arranged into the k-space by the arranging unit 133a subsequent to the digital conversion; however, for the sake of convenience in the explanation, the phrase "the sequence controlling unit 120 acquires k-space data" will be used hereinafter as necessary. In addition, the MR signals corresponding to the k-space data may be hereinafter referred to as "echo signals".

By controlling the execution of a pulse sequence, the sequence controlling unit 120 acquires MR signals corresponding to the plurality of channels in the pulse sequence executed as a series, the MR signals being configured to be arranged into a first region of the k-space so as to be positioned at first intervals and into a second region larger than the first region so as to be positioned at second intervals larger than the first intervals. Phase encoding patterns of the acquisition performed by the sequence controlling unit 120 will be explained in three groups. The first group is made up of patterns in which all the pieces of k-space data to be arranged into the k-space so as to be positioned at mutually-different intervals are acquired continuously (spontaneous) without any waiting time. The second group is made up of patterns in which the data is acquired in divided sections in correspondence with each of mutually-different intervals. In other words, the second group is made up of patterns in which the k-space data to be arranged into the k-space so as to be positioned at the first intervals and the k-space data to be arranged into the k-space so as to be positioned at the second intervals are separately acquired with a waiting time between the acquisitions. The third group is made up of patterns in which, although the data is acquired in divided sections like in the second group, the data is not acquired in correspondence with each of the mutually-different intervals, but as a result of arranging the k-space data acquired in the divided sections into the k-space, it turns out that the data is arranged in the k-space so as to be positioned at mutually-different intervals. In other words, the third group is made up of patterns in which both of the k-space data to be arranged into the k-space so as to be positioned at the first intervals and the k-space data to be arranged into the k-space so as to be positioned at the second intervals are acquired as a result of acquiring the pieces of k-space data with a waiting time between the acquisitions. The dividing is not limited to dividing into two sections. Dividing into three or more sections is also acceptable.

Figure 5:
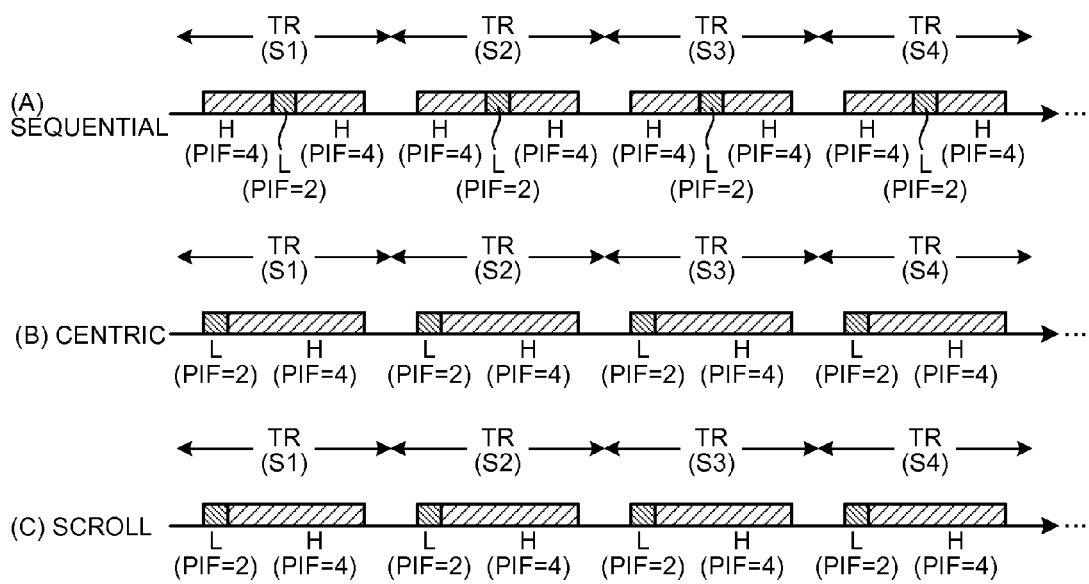
FIG. 5 is another drawing for explaining the phase encoding pattern according to the first embodiment.

FIGS. 4 and 5 illustrate phase encoding patterns in the first group. The sequence controlling unit 120 continuously acquires, without any waiting time, the pieces of k-space data to be arranged into a central part of the k-space while satisfying PIF=2 and to be arranged into the entire region including a peripheral part while satisfying PIF=4, by using a sequential order method, a centric order method, or a scroll order method. In FIG. 4, the numbers on the right-hand side of the table indicate the order in which the pieces of data are acquired. The sequence controlling unit 120 acquires the pieces of k-space data while applying a phase encoding gradient magnetic field $G_{PE}$ corresponding to the amount of phase encoding shown in FIG. 4. More specifically, when using the sequential order method, for example, the sequence controlling unit 120 continuously acquires the pieces of k-space data, starting from a phase encode in one end of the k-space in an order following the phase encoding direction, as shown in FIG. 4. When using the centric order method, for example, the sequence controlling unit 120 continuously acquires the pieces of k-space data, starting from a phase encode in the central part and gradually working toward the peripheral part, while alternating the polarity of the phase encoding gradient magnetic field $G_{PE}$, as shown in FIG. 4. When using the scroll order method, for example, the sequence controlling unit 120 acquires the pieces of k-space data, starting from a phase encode in the central part along one direction, and when having reached an end of the k-space, the sequence controlling unit 120 acquires the pieces of k-space data corresponding to the rest of the phase encodes having the opposite polarity, as shown in FIG. 4.

The processes described above are expressed on a temporal axis in FIG. 5. In FIG. 5 and other drawings, "TR (Repetition Time)" denotes a repetition time. The letter "S" denotes one slice in an acquisition of two-dimensional data and denotes one slice encode in an acquisition of three-dimensional data. In some situations, "S" may denote one segment. Further, the letter "H" indicates acquiring k-space data corresponding to the peripheral part of the k-space, i.e., a high frequency region, whereas the letter "L" indicates acquiring k-space data corresponding to the central part of the k-space, i.e., a low frequency region.

As shown in FIG. 5(A), when using the sequential order method, the sequence controlling unit 120 performs, in a single TR, a continuous acquisition for the peripheral part satisfying PIF=4, an acquisition for the central part satisfying PIF=2, and an acquisition for the peripheral part satisfying PIF=4 without any waiting time. In another example, when using the centric order method as shown in FIG. 5(B), the sequence controlling unit 120 performs, in a single TR, a continuous acquisition for the central part satisfying PIF=2 and an acquisition for the peripheral part satisfying PIF=4 without any waiting time. In yet another example, when using the scroll order method as shown in FIG. 5(C), the sequence controlling unit 120 also performs, in a single TR, a continuous acquisition for the central part satisfying PIF=2 and an acquisition for the peripheral part satisfying PIF=4 without any waiting time. In FIG. 5, the example is explained in which the acquisitions for both of the central part and the peripheral part of the k-space are performed in a single TR; however, the exemplary embodiments are not limited to this example. Acquisitions of the central part and the peripheral part of the k-space may be performed in a plurality of TRs instead of a single TR. In the second group, the third group, and other exemplary embodiments explained below, similarly to the above, for example, acquisitions of k-space data for one slice, one slice encode, or one segment may be performed in a plurality of TRs instead of a single TR. In FIG. 5, the example is explained in which the acquisition for the peripheral part corresponding to PIF=4 and the acquisition for the central part corresponding to PIF=2 are performed; however, the exemplary embodiments are not limited to this example. The acquisition for the peripheral part corresponding to PIF=2 and the acquisition for the central part corresponding to PIF=4 may be performed. The relation of density may be opposite. In the second group, the third group, and other exemplary embodiments explained below, similarly to the above.

Figure 6:
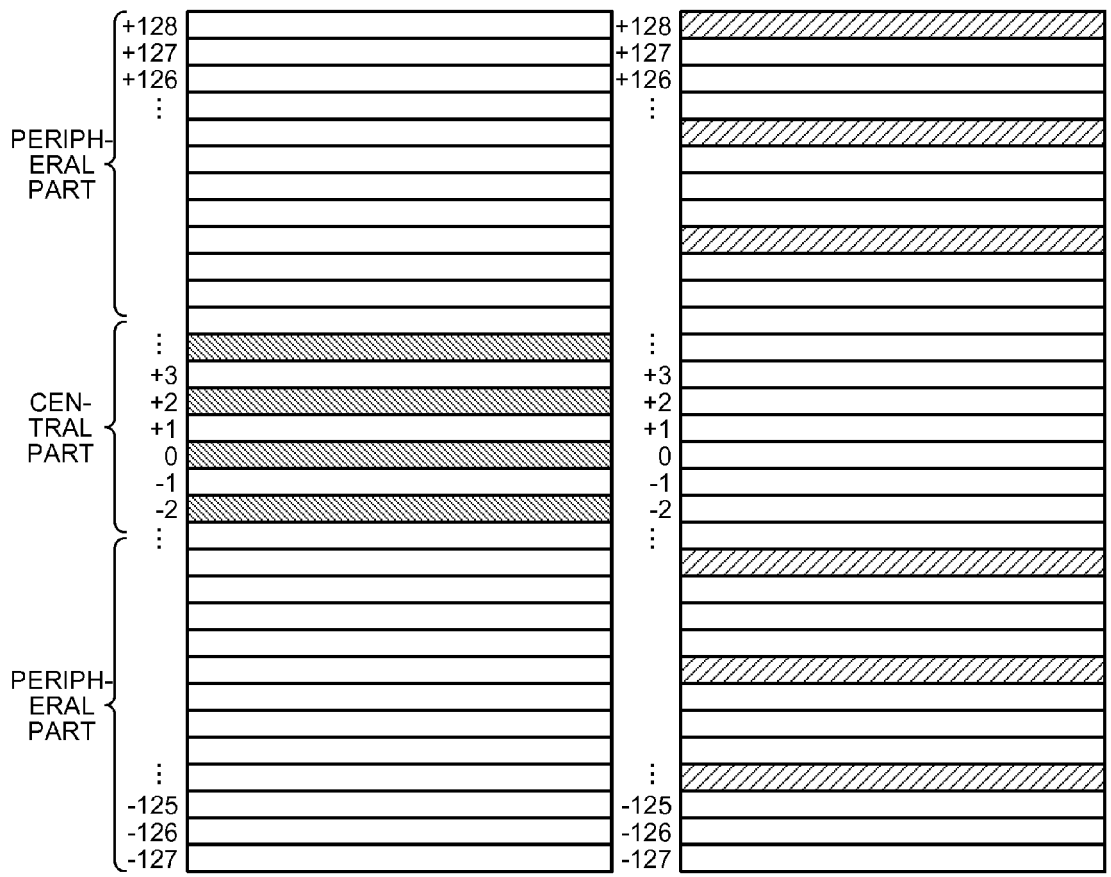
FIG. 6 is a drawing for explaining yet another phase encoding pattern according to the first embodiment.
Figure 7:
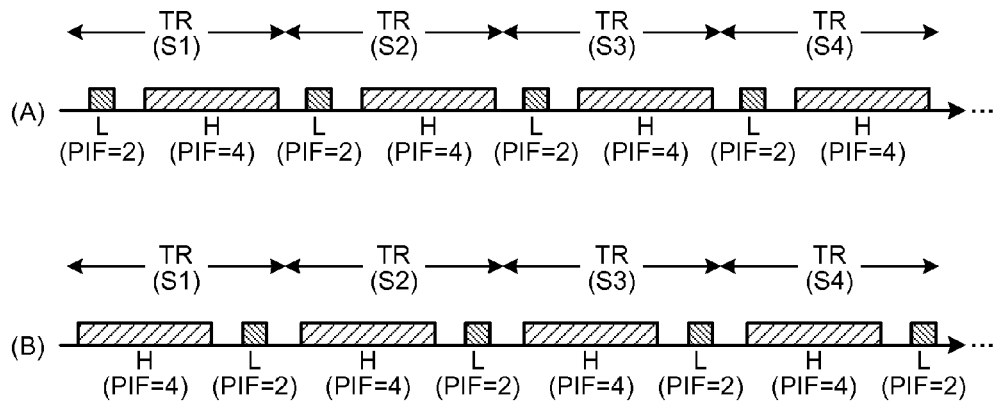
FIG. 7 is another drawing for explaining the phase encoding pattern according to the first embodiment.

Next, FIGS. 6 and 7 illustrate phase encoding patterns in the second group. The sequence controlling unit 120 first acquires the k-space data to be arranged into the central part of the k-space while satisfying PIF=2 and subsequently, after a waiting time, acquires the k-space data to be arranged into the peripheral part of the k-space while satisfying PIF=4. These processes are expressed on a temporal axis in FIG. 7. As shown in FIG. 7(A), in a single TR, the sequence controlling unit 120 performs the acquisition for the central part satisfying PIF=2 and subsequently, after a waiting time, performs the acquisition for the peripheral part satisfying PIF=4. In another example, as shown in FIG. 7(B), in a single TR, the sequence controlling unit 120 may perform the acquisition for the peripheral part satisfying PIF=4 and subsequently, after a waiting time, may perform the acquisition for the central part satisfying PIF=2. Further, the acquisitions may be performed by implementing the sequential order method or the centric order method.

Figure 8:
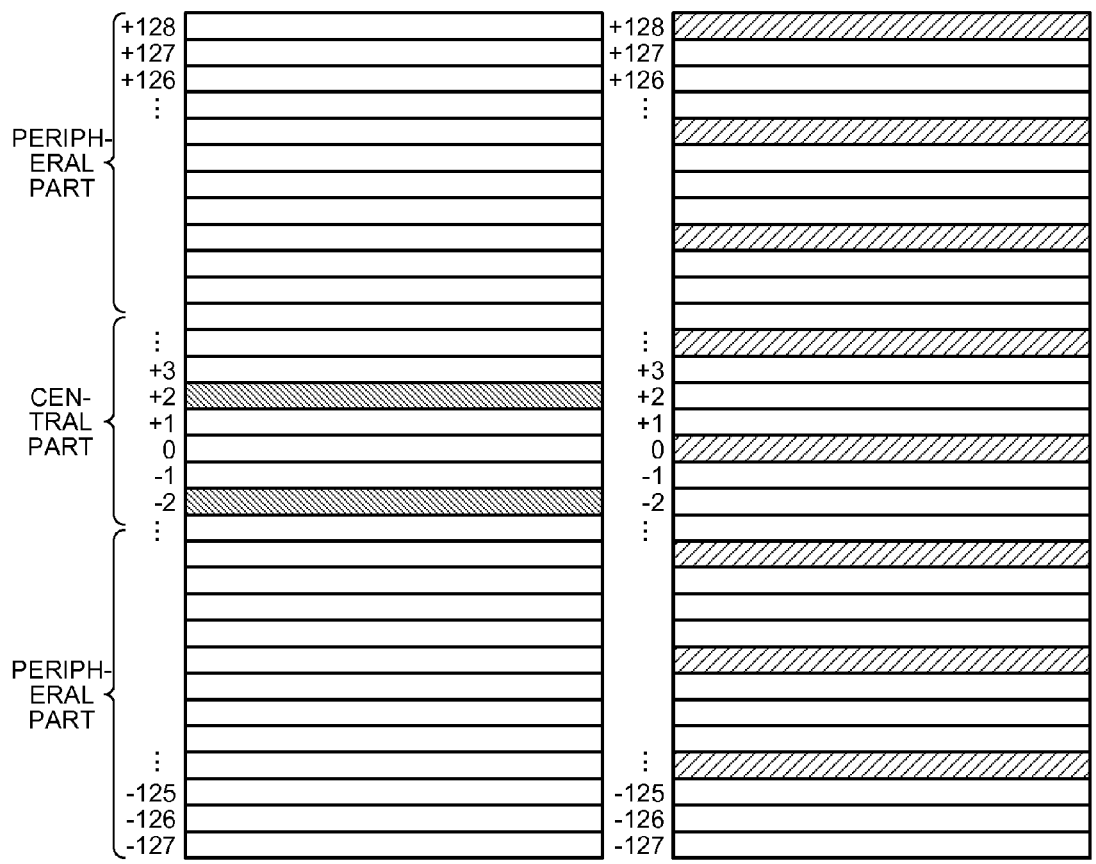
FIG. 8 is yet another drawing for explaining the phase encoding pattern according to the first embodiment.
Figure 9:
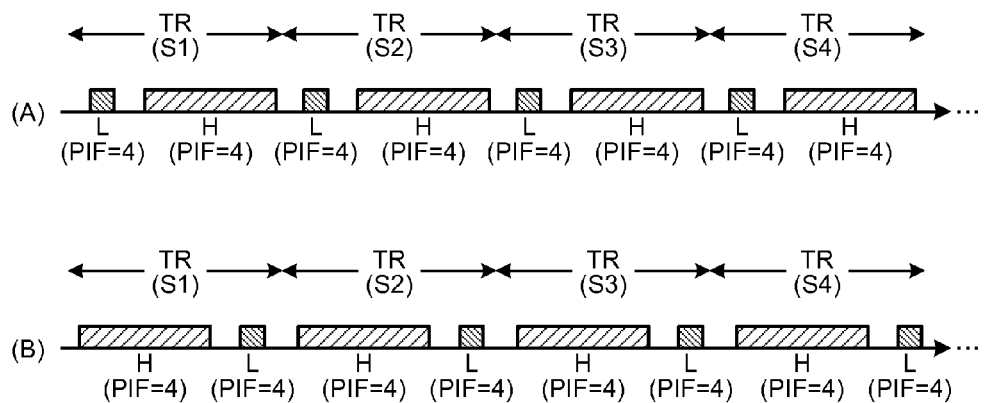
FIG. 9 is another drawing for explaining the phase encoding pattern according to the first embodiment.

Next, FIGS. 8 and 9 illustrate phase encoding patterns in the third group. The sequence controlling unit 120 first acquires a part of the k-space data to be arranged into the central part of the k-space satisfying PIF=2 while satisfying PIF=4, and subsequently, after a waiting time, acquires the k-space data to be arranged into the central part of the k-space satisfying PIF=2 and the k-space data to be arranged into the peripheral part satisfying PIF=4, while satisfying PIF=4. In the present example, the phase encodes in the k-space data acquired in the first half and the phase encodes in the k-space data acquired in the second half are staggered by "two". Consequently, when the pieces of k-space data acquired in the divided sections have been arranged in the k-space, the pieces of k-space data are positioned in the k-space at the mutually-different intervals.

These processes are expressed on a temporal axis in FIG. 8. As shown in FIG. 8(A), in a single TR, the sequence controlling unit 120 performs the acquisition for the central part satisfying PIF=4 and subsequently, after a waiting time, performs the acquisition for the entire region satisfying PIF=4, in such a manner that the phase encodes are staggered by "two". In another example, as shown in FIG. 8(B), in a single TR, the sequence controlling unit 120 may perform the acquisition for the entire region satisfying PIF=4 and subsequently, after a waiting time, may perform the acquisition for the central part satisfying PIF=4, in such a manner that the phase encodes are staggered by "two". Further, the acquisitions may be performed by implementing the sequential order method, the centric order method, or the scroll order method. When using any of the phase encoding patterns in the third group, it may be desirable, in some situations, to adjust the timing so that the acquisition for the central part satisfying PIF=4 and the acquisition for the central part included in the acquisition for the entire region satisfying PIF=4 are performed in mutually the same time phase.

Figure 10:
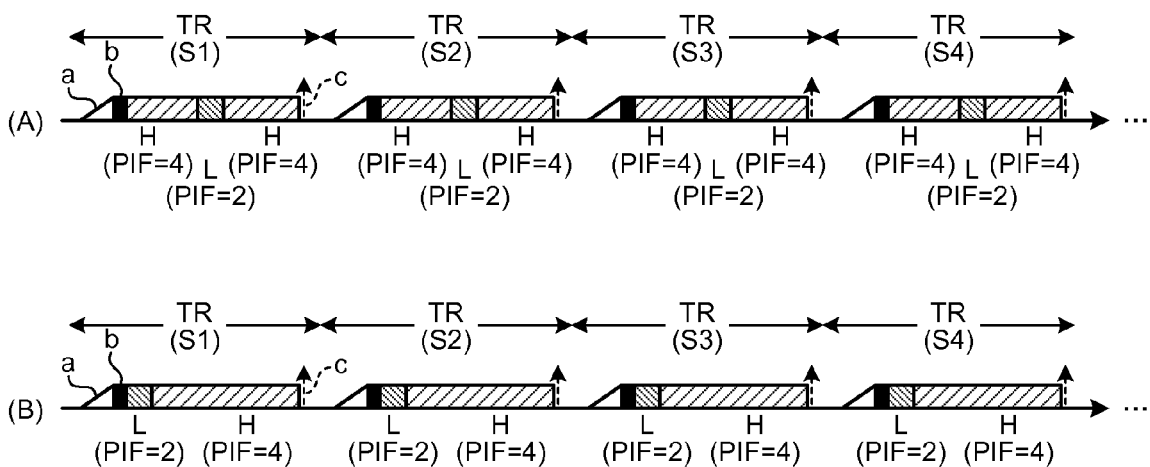
FIG. 10 is a drawing for explaining yet another phase encoding pattern according to the first embodiment.
Figure 11:
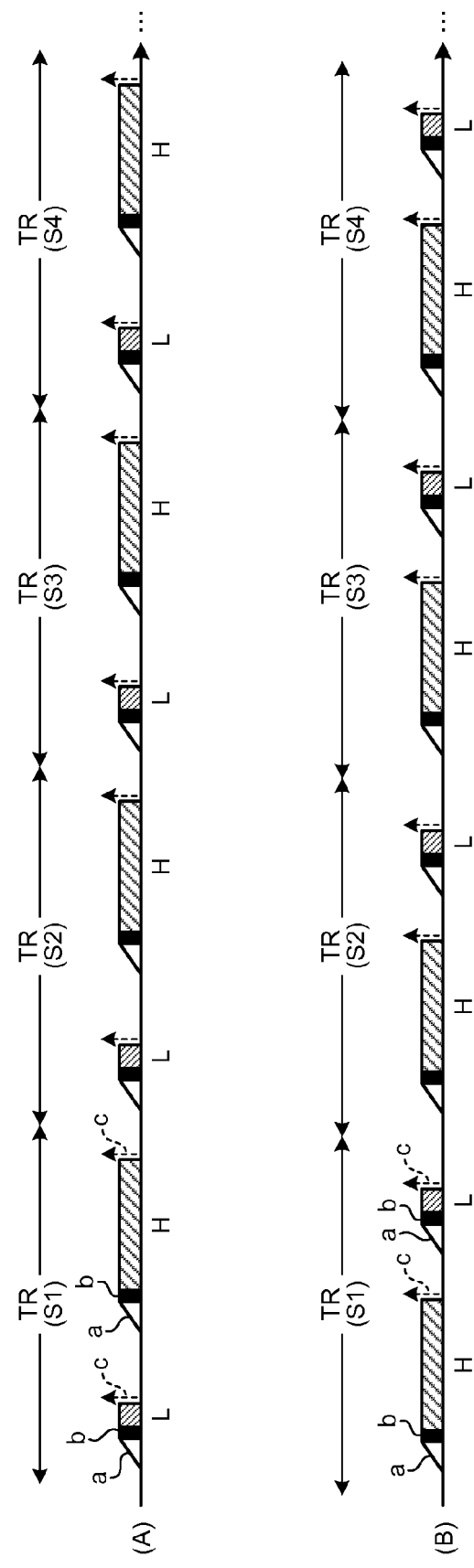
FIG. 11 is another drawing for explaining the phase encoding pattern according to the first embodiment.

Next, FIGS. 10 and 11 are drawings for explaining a situation where a ramp-up pulse or a preparation portion is applied prior to an imaging scan and a situation where a flip-back pulse is applied after an imaging scan. FIG. 10 corresponds to phase encoding patterns 1 described above; FIG. 10(A) corresponds to the sequential order method, whereas FIG. 10(B) corresponds to the centric order method and the scroll order method. FIG. 11 corresponds to phase encoding patterns 2 and 3 described above. FIGS. 11(A) and 11(B) illustrate patterns obtained by reversing the acquisition order.

For example, let us discuss a bSSFP pulse sequence as the pulse sequence to be executed during an imaging scan. With a bSSFP pulse sequence, a nuclear spin in the magnetostatic field is maintained in a steady state by repeating the excitation using an RF pulse. For example, the sequence controlling unit 120 applies a +α/2 excitation pulse or a −α/2 excitation pulse as a ramp-up pulse. Subsequently, the sequence controlling unit 120 repeatedly and alternately applies a +α excitation pulse and a −α excitation pulse, in each of the TRs. Due to these +α excitation pulses and −α excitation pulses, the nuclear spin in the magnetostatic field is maintained in a steady state.

In FIGS. 10 and 11, the portions indicated with the reference character "a" are the pulses applied as the ramp-up pulses. As shown in FIG. 10, when the data is continuously acquired in a single TR without any waiting time, it is sufficient if a ramp-up pulse is applied prior to that imaging scan. In contrast, as shown in FIG. 11, when the data is acquired in divided sections in a single TR, it is sufficient if a ramp-up pulse is applied prior to each of the acquisitions. Even in the situation where the data is acquired in divided sections in a single TR, it is also acceptable to apply a ramp-up pulse only prior to one of the acquisitions.

In other examples, the sequence controlling unit 120 may apply, as a preparation portion, a fat suppression pulse, an Inversion Recovery (IR) pulse, a Short Time IR (STIR) pulse, a T2 prep pulse, a flow prep pulse, or the like. The T2 prep pulse is applied prior to an imaging scan for the purpose of realizing T2-weighted imaging. For example, a 90° pulse, a 180° pulse or a −90° pulse can be applied as the T2 prep pulse. The flow prep pulse is applied for the purpose of selectively emphasizing (or suppressing) a blood vessel extending in a specific direction. For example, a rephrase pulse, a diphase pulse, a Motion Probing Gradient (MPG) pulse having a small intensity, or the like can be applied as the flow prep pulse in at least one of the frequency encoding direction, the phase encoding direction, and the slice encoding direction.

In FIGS. 10 and 11, the portions indicated with the reference character "b" are the pulses in the preparation portions. As shown in FIG. 10, when the data is continuously acquired in a single TR without any waiting time, it is sufficient if a preparation-portion pulse is applied prior to that imaging scan. In contrast, as shown in FIG. 11, when the data is acquired in divided sections in a single TR, it is sufficient if a preparation-portion pulse is applied prior to each of the acquisitions. Even in the situation where the data is acquired in divided sections in a single TR, it is also acceptable to apply a preparation-portion pulse only prior to one of the acquisitions.

In the first embodiment, the ramp-up pulse is applied, and subsequently, the preparation-portion pulse is applied, before the imaging scan is performed. This arrangement is made because it is considered possible to make an advantageous effect of the preparation-portion pulse prominent by applying the preparation-portion pulse at a stage where the ramp-up pulse has achieved a certain degree of approximation to a steady state.

In another example, the sequence controlling unit 120 may apply, after performing an imaging scan, a flip back pulse (e.g., T2 plus) for reversing a longitudinal magnetization of a nuclear spin. By applying the flip back pulse, it is possible to shorten the image taking period.

In FIGS. 10 and 11, the pulses indicated with the reference character "c" are flip back pulses. As shown in FIG. 10, when the data is continuously acquired in a single TR without any waiting time, it is sufficient if a flip back pulse is applied following that imaging scan. In contrast, as shown in FIG. 11, when the data is acquired in divided sections in a single TR, it is sufficient if a flip back pulse is applied following each of the acquisitions. Even in the situation where the data is acquired in divided sections in a single TR, it is also acceptable to apply a flip back pulse only after one of the acquisitions.

Not all the pulses described above necessarily have to be applied; it is acceptable if only one or more of the pulses are applied. Also, the order in which the pulses are applied can be modified as necessary.

As described above, according to the first embodiment, it is possible to shorten the image taking period by performing the set of acquisitions combining the acquisition for the central part of the k-space satisfying PIF=2 with the acquisition for the peripheral part having a larger region satisfying PIF=4, compared with the image taking period when the entire region of the k-space is acquired while satisfying PIF=2. Furthermore, according to the first embodiment, it is also possible to prevent the SNR from dropping, by implementing the method by which the reconstructing process is performed by filling in the k-space data satisfying PIF=2 on the basis of the k-space data satisfying PIF=4. In other words, according to the first embodiment, it is possible to improve the image quality while performing the high-speed image taking process.

Further, according to the first embodiment, the k-space data is acquired in such a manner that the intervals in the central part (the low frequency region) of the k-space are smaller than the intervals in the peripheral part (the high frequency region). Consequently, because more low-frequency components, which determine the image contrast, are acquired, it is possible to prevent the SNR ratio from dropping more efficiently. Further, according to the first embodiment, because the time period required by the acquisition for the central part of the k-space is shortened, it is possible to expect impacts of movements and signal blurs to decrease. Furthermore, because all the acquisitions performed by the sequence controlling unit 120 for, for example, the phase encoding patterns in the second group and the third group according to the first embodiment are acquisitions that are performed at regular intervals using the PI method, it is also possible to expect an advantageous effect where occurrence of sound is inhibited.

Second Embodiment

In a second embodiment, on the assumption that the MRI apparatus 100 having the same configuration as that in the first embodiment is used, an example will be explained as an application utilization example where a still image of the heart in a certain cardiac phase is taken without a contrast enhancement. More specifically, in the second embodiment, an electrocardiogram-synchronized (hereinafter, "ECG-synchronized") three-dimensional segmented FFE (hereinafter, "seg. FFE") is used as an imaging scan.

The exemplary embodiments are not limited to the examples described above. The image taking target is not limited to a still image of the heart. For example, other sites such as the head, a lung field, the abdomen, or the like may be used. Also, the image may be other images such as an image of Cerebrospinal Fluid (CSF) or lymph fluid. Further, the exemplary embodiments are not limited to the example involving an ECG synchronization. For example, a respiratory synchronization may be used. Alternatively, an ECG synchronization and a respiratory synchronization may be used in combination. Further, the imaging scan does not necessarily have to be seg. FFE scans. Any other types of pulse sequences may be used.

Figure 12:
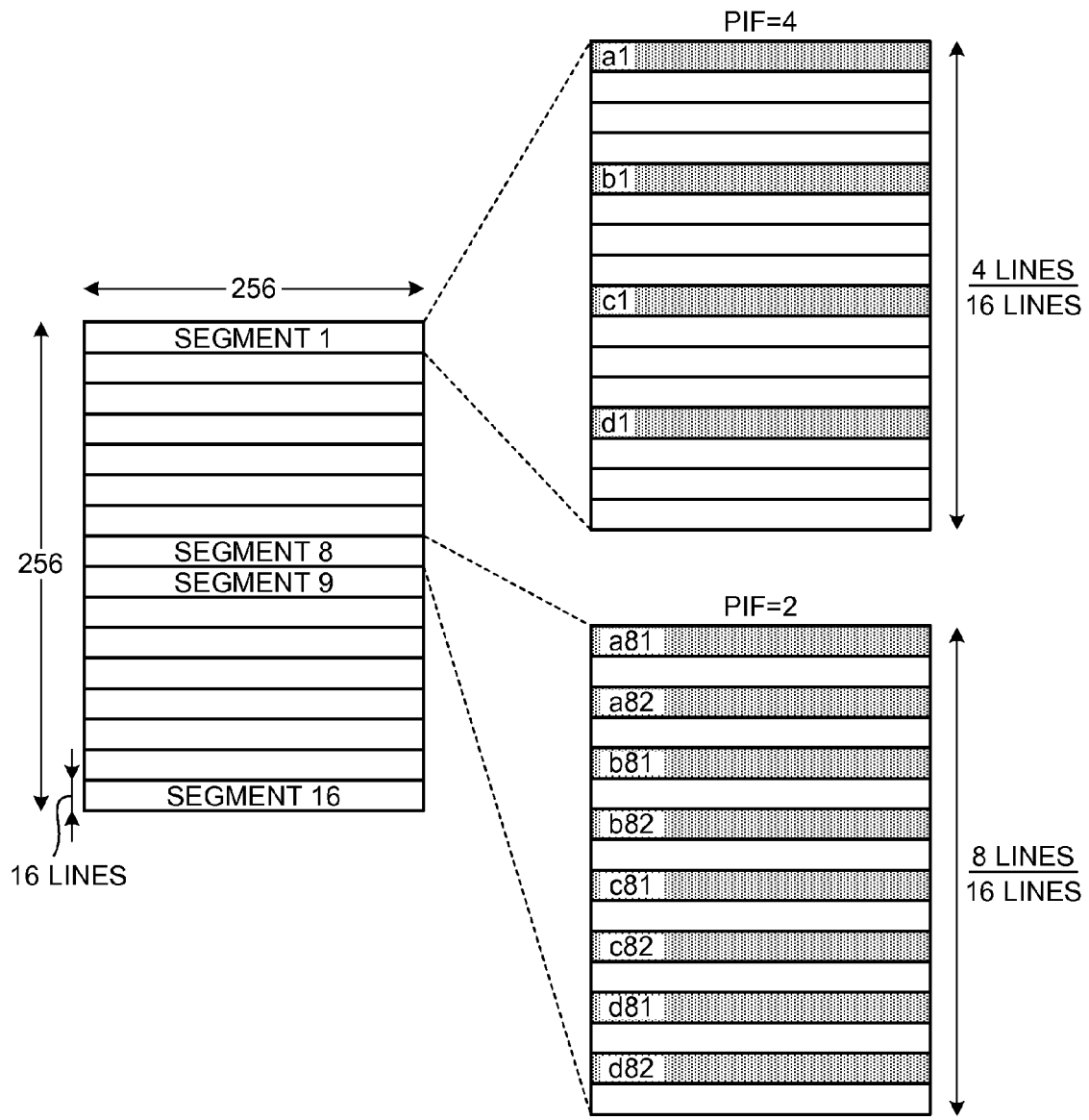
FIG. 12 is a drawing for explaining a process of dividing a k-space into segments according to a second embodiment.

Next, the imaging scan will be explained. FIG. 12 is a drawing for explaining a process of dividing a k-space into segments according to the second embodiment. With reference to FIG. 12, an example will be explained in which, for the sake of convenience, the k-space corresponding to one slice encode is depicted two-dimensionally, while the k-space corresponding to 256×256 is divided into sixteen segments, for example. The horizontal axis corresponds to the frequency encoding, whereas the vertical axis corresponds to the phase encoding. Each of the segments contains sixteen lines of k-space data. As explained later, for example, the sequence controlling unit 120 acquires, from each of all the segments, echo signals in one or more lines contained in the segment, between an R wave and a subsequent R wave (during one R-R period). Further, the sequence controlling unit 120 acquires all the echo signals corresponding to one image, by repeatedly performing such an acquisition over a plurality of heartbeats, while changing the acquisition target lines.

In this situation, as shown in FIG. 12, for example, the sequence controlling unit 120 acquires the echo signals while satisfying PIF=2, for "Segment 8" and "Segment 9" that correspond to the central part of the k-space and acquires the echo signals while satisfying PIF=4, for the other segments. In other words, for each of the segments corresponding to the central part of the k-space, the sequence controlling unit 120 acquires the echo signals in eight lines from among the sixteen lines. In contrast, for each of the segments corresponding to the peripheral part of the k-space, the sequence controlling unit 120 acquires the echo signals in four lines from among the sixteen lines. In this manner, the sequence controlling unit 120 performs the acquisitions in such a manner that the quantity of lines acquired from a segment corresponding to the central part of the k-space is larger than the quantity of lines acquired from a segment corresponding to the peripheral part of the k-space.

In FIG. 12, for example, the first, the fifth, the ninth, and the thirteenth lines contained in "Segment 1" will be referred to as "a1", "b1" "c1", and "d1", respectively. Similarly, for example, the first, the fifth, the ninth, and the thirteenth lines contained in "Segment 2" will be referred to as "a2", "b2" "c2", and "d2", respectively. In contrast, for example, the first, the third, the fifth, the seventh, the ninth, the eleventh, the thirteenth, and the fifteenth lines contained in "Segment 8" will be referred to as "a81", "a82", "b81", "b82", "c81", "c82", "d81", and "d82", respectively.

Figure 13:
FIG. 13 is a drawing for explaining an imaging scan according to the second embodiment.

FIG. 13 is a drawing for explaining an imaging scan according to the second embodiment. For example, in the first single R-R period, the sequence controlling unit 120 sequentially acquires the lines positioned at the phase encode "a" shown in FIG. 12, from "Segment 1" through "Segment 16". In other words, as shown in FIG. 13, by using the sequential order method, the sequence controlling unit 120 performs, without any waiting time, a continuous acquisition corresponding to the peripheral part of the k-space and satisfying PIF=4, an acquisition corresponding to the central part of the k-space and satisfying PIF=2, and an acquisition corresponding to the peripheral part of the k-space and satisfying PIF=4. Further, the sequence controlling unit 120 sets a delay period since an R wave in such a manner that the optimal delay period derived from the preparatory scan corresponds to the acquisition time of the line corresponding to the central part of the k-space (e.g., "a81").

Further, as shown in FIG. 13, the sequence controlling unit 120 sequentially acquires, in each of the subsequent R-R periods, the lines positioned at the phase encodes "b", "c" and "d" shown in FIG. 12, from "Segment 1" through "Segment 16". In this manner, the sequence controlling unit 120 acquires the echo signals corresponding to one slice encode in the four R-R periods, for example. By further repeating this process for each of the slice encodes, the sequence controlling unit 120 acquires the echo signals to be arranged into the three-dimensional k-space.

The echo signals acquired in this manner are subsequently arranged into the k-space and serve as processing targets of the image generating unit 136. Like in the first embodiment described above, the image generating unit 136 may implement, as the PI method used for generating the image, the method to which the SENSE-based technique is applied, the method to which GRAPPA is applied, the method combining GRAPPA and SENSE, or the like.

In the second embodiment, as shown in FIG. 13, the example using the sequential order method is explained; however, the exemplary embodiments are not limited to this example. As explained in the first embodiment, the exemplary embodiments are similarly applicable to the situations where the centric order method or the scroll order method is used.

As described above, according to the second embodiment, it is possible to improve the image quality while performing the high-speed image taking process, like in the first embodiment. More specifically, according to the second embodiment, because the PIF is increased for at least the peripheral part of the k-space, the time period required by acquiring the echo signals in a single R-R period is shortened. It is therefore possible to expect impacts of movements and signal blurs to decrease. Further, because the k-space data is acquired at the relatively smaller intervals for the central part of the k-space, it is possible to prevent the SNR from dropping.

Third Embodiment

In a third embodiment, on the assumption that the MRI apparatus 100 having the same configuration as that in the first embodiment is used, an example will be explained as an application utilization example where a bloodstream image of a lower extremity is taken without a contrast enhancement so as to generate a bloodstream image in which arteries and veins are separated. This utilization example may be referred to as "(artery-and-vein-separated) Fresh Blood Imaging (FBI)" in the sense that an image of the fresh blood pumped out of the heart is taken. More specifically, in the third embodiment, an ECG-synchronized three-dimensional FSE is used as an imaging scan. Further, in the third embodiment, a preparatory scan is performed for the purpose of finding a cardiac phase corresponding to systole in which the signal values of the arteries are suppressed and a cardiac phase corresponding to diastole in which the signal values of the arteries and the veins become high. An ECG-synchronized two-dimensional FSE may be used as the preparatory scan. As mentioned in the first embodiment, the preparatory scan may be referred to as an "Electrocardiogram (ECG)-prep" scan.

The exemplary embodiments are not limited to the examples described above. The image taking target is not limited to a bloodstream image of a lower extremity. For example, other sites such as the head, a lung field, the abdomen, the heart, or the like may be used. Also, the image may be an image of other fluids such as cerebrospinal fluid or lymph fluid. Further, the exemplary embodiments are not limited to the example involving an ECG synchronization. For example, a respiratory synchronization may be used. Alternatively, an ECG synchronization and a respiratory synchronization may be used in combination. Further, the preparatory scan and the imaging scan do not necessarily have to be FSE scans. For example, an FASE scan combining a half-Fourier method with an FSE scan or EPI may be used. Furthermore, the preparatory scan may be omitted.

First, the preparatory scan will be explained briefly. The sequence controlling unit 120 determines the timing with which the echo signals are acquired during the imaging scan, by performing an ECG-synchronized preparatory scan, prior to the imaging scan. For example, the sequence controlling unit 120 sets a plurality of delay periods since a peak value of an R wave in an ECG signal. The sequence controlling unit 120 then acquires echo signals used for generating an image at each of the delay periods, by varying the delay periods over a plurality of heartbeats.

The image generating unit 136 generates the image corresponding to each of the delay periods, from the echo signals acquired while the delay periods are varied. An optimal delay period corresponding to a cardiac phase in which the bloodstream has a high signal value during each of the systole and the diastole is derived by, for example, displaying the images corresponding to the mutually-different delay periods on the display unit 135 so that the operator can view and compare the images. Alternatively, the optimal delay period may be derived by comparing and analyzing the signal values in a predetermined area of the images. The optimal delay period derived by performing the preparatory scan in this manner is set as an acquisition time at which the echo signals to be arranged into the central part of the k-space are acquired during the imaging scan. In the following sections, an example will be explained in which the PI method by which the acquisitions are performed while combining the mutually-different intervals is applied to the imaging scan; however, the PI method is similarly applicable to the preparatory scan.

Generally speaking, for the purpose of equalizing the image quality and the like, a preparatory scan and an imaging scan are often performed while using mutually the same image taking conditions (e.g., the type of the pulse sequence and the image taking parameters) except for the difference between two-dimensional and three-dimensional; however, the exemplary embodiments are not limited to this example. The preparatory scan and the imaging scan both may be performed two-dimensionally or both may be performed three-dimensionally. The preparatory scan and the imaging scan may be performed under mutually-different image taking conditions. The same applies to the embodiments other than the second embodiment.

Figure 14:
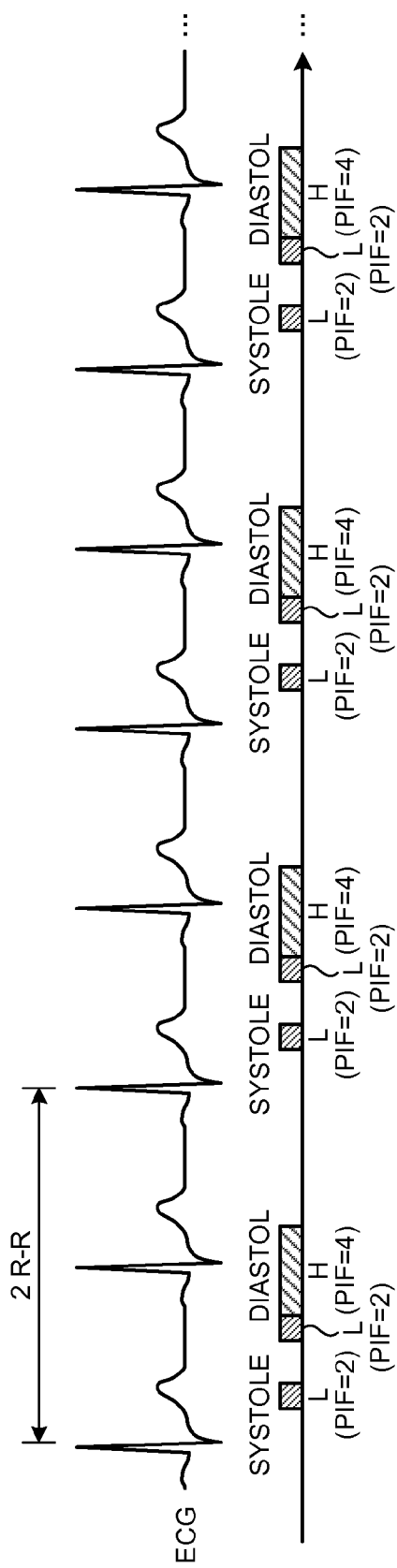
FIG. 14 is a drawing for explaining an imaging scan according to a third embodiment.

Next, the imaging scan will be explained. FIG. 14 is a drawing for explaining an imaging scan according to the third embodiment. For example, in two R-R periods, the sequence controlling unit 120 acquires echo signals during systole and diastole corresponding to one slice encode. For example, when the predetermined delay period has elapsed since a peak of the R-wave, the sequence controlling unit 120 first acquires the echo signals during the systole to be arranged into the central part of the k-space while satisfying PIF=2. Subsequently, when the predetermined delay period has elapsed again, the sequence controlling unit 120 continuously acquires, without any waiting time, the echo signals during the diastole to be arranged into the entire region of the k-space while changing the PIF from PIF=2 to PIF=4, by using the centric order method or the scroll order method. In other words, in the third embodiment, the sequence controlling unit 120 acquires the echo signals only for the central part with respect to the systole and acquires the echo signals for the entire region with respect to the diastole. As described later, to generate an image corresponding to the systole, the echo signals for the peripheral part acquired with respect to the diastole are substitutionally used.

In the third embodiment, as shown in FIG. 14, the example is explained in which the echo signals during the systole are acquired first, and subsequently, the echo signals during the diastole are acquired; however, the exemplary embodiments are not limited to this example. It is acceptable to acquire the echo signals during the diastole first, and subsequently acquire the echo signals during the systole. Further, in the third embodiment, the example is explained in which the echo signals during the diastole are acquired with respect to the entire region of the k-space so that the echo signals can substitutionally be used in the generation of the image corresponding to the systole; however, the exemplary embodiments are not limited to this example. It is acceptable to acquire the echo signals during the systole with respect to the entire region of the k-space so that the echo signals can substitutionally be used in the generation of an image corresponding to the diastole. Further, in the third embodiment, as shown in FIG. 14, the example using the centric order method or the scroll order method is explained; however, the exemplary embodiments are not limited to this example. As explained in the first embodiment, the exemplary embodiments are similarly applicable even to a situation where the sequential order method is used.

The echo signals acquired in this manner are subsequently arranged into the k-space and serve as processing targets of the image generating unit 136. Like in the first embodiment described above, the image generating unit 136 may implement, as the PI method used for generating the image, the method to which the SENSE-based technique is applied, the method to which GRAPPA is applied, the method combining GRAPPA and SENSE, or the like.

Figure 15:
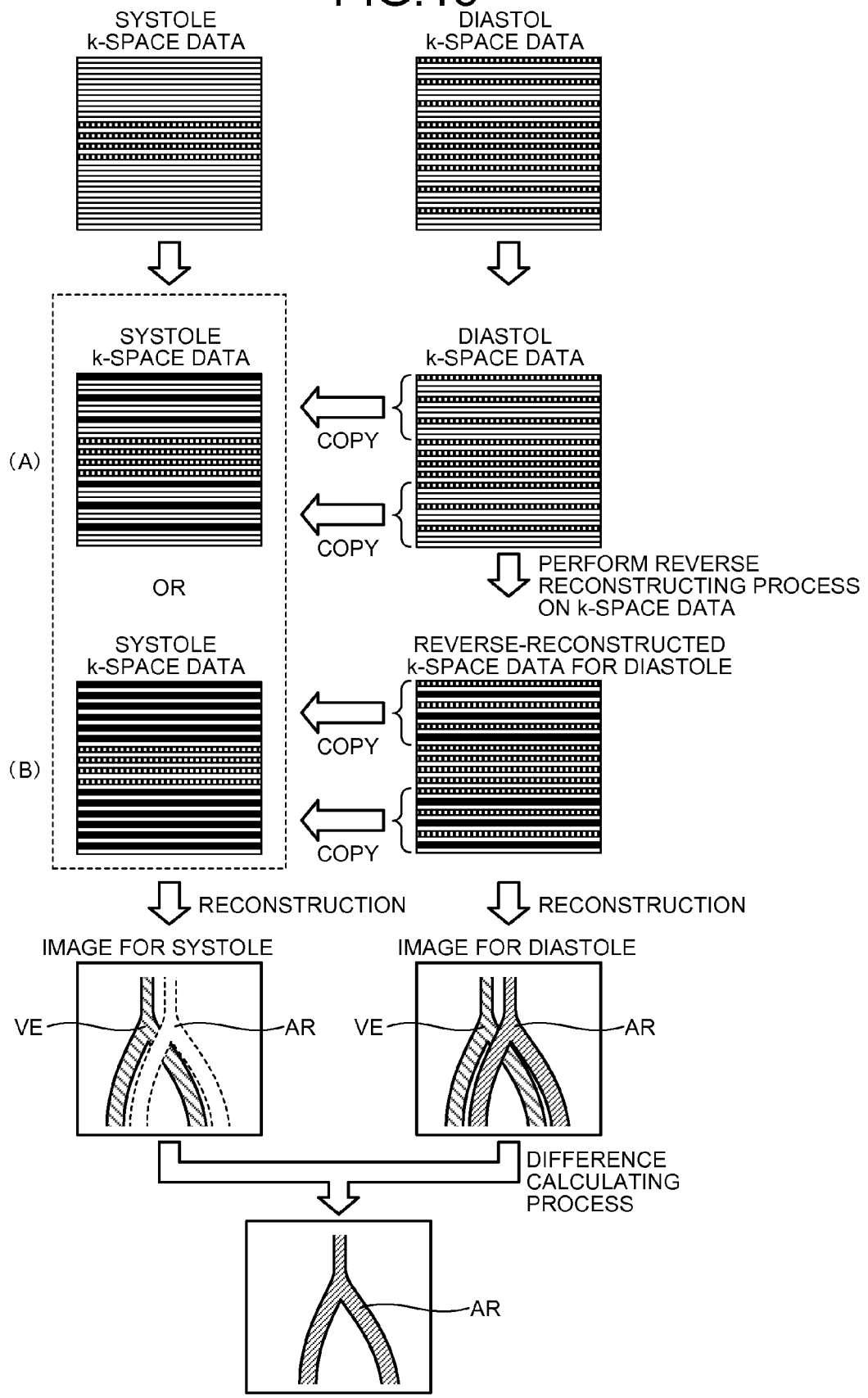
FIG. 15 is a drawing for explaining an example of an image generating process according to the third embodiment.

FIG. 15 is a drawing for explaining an example of an image generating process according to the third embodiment. FIG. 15 illustrates a method to which the SENSE-based technique is applied. Further, for the sake of convenience in the explanation, two-dimensional k-space data and two-dimensional images are used in the explanation with reference to FIG. 15; however, as mentioned above, when three-dimensional k-space data is acquired in an imaging scan, a three-dimensional image is typically generated from the three-dimensional k-space data.

As shown in FIG. 15, the k-space data during the systole is arranged satisfying PIF=2 only in the central part. In contrast, the k-space data during the diastole is arranged satisfying PIF=4 in the peripheral part and is arranged satisfying PIF=2 in the central part. In FIG. 15, the patterns marked with vertical stripes indicate k-space data actually acquired.

The image generating unit 136 generates images corresponding to the systole and to the diastole. For example, the image generating unit 136 generates the image corresponding to the diastole by performing processes (a) through (g) explained with reference to FIGS. 3A and 3B on the k-space data during the diastole. Further, to generate the image corresponding to the systole, the image generating unit 136 substitutionally uses (e.g., copies) the k-space data during the diastole. In this situation, from the aspect of the stage at which the k-space data during the diastole is substitutionally used, two methods are possible. In FIG. 15, the patterns marked solid indicate k-space data that is generated by copying or by performing a reverse reconstructing process.

One of the possible methods is, as shown in FIG. 15(A), a method by which the "k-space data actually acquired" during the diastole is copied so as to be filled in as the k-space data for the peripheral part corresponding to the systole. In that situation, the k-space data corresponding to the systole is, as shown in FIG. 15(A), data arranged in the entire region including the peripheral part while satisfying PIF=4 and in the central part while satisfying PIF=2. Thus, the image generating unit 136 generates an image corresponding to the systole by performing processes (a) through (g) explained with reference to FIGS. 3A and 3B on the k-space data.

The other possible method is, as shown in FIG. 15(B), a method by which k-space data satisfying PIF=2 is generated with respect to the diastole, and subsequently, the k-space data for the peripheral part is copied so as to be filled in as k-space data for the peripheral part corresponding to the systole. In that situation, the image generating unit 136 first generates k-space data corresponding to the diastole and satisfying PIF=2, by performing processes (a) through (d) (or (e)) explained with reference to FIGS. 3A and 3B on the k-space data actually acquired during the diastole. Subsequently, the image generating unit 136 copies the k-space data for the peripheral part corresponding to the diastole, as k-space data for the peripheral part corresponding to the systole. The k-space data corresponding to the systole is, as shown in FIG. 15(B), data that is arranged in the entire region of the k-space while satisfying PIF=2. Thus, the image generating unit 136 generates an image corresponding to the systole, by performing processes (e) and (f) explained with reference to FIG. 3B on the k-space data.

In this situation, as shown in FIG. 15, in the image corresponding to the systole, the veins (VE) are rendered as "bright blood" (white) having a higher signal value, whereas the arteries (AR) are rendered as "bright blood" having a lower signal value. This is because, during systole, the flow rate of the arteries is higher than the flow rate of the veins, which flow at a lower speed. In FIG. 15, for the sake of convenience in the explanation, the arteries rendered as bright blood having a lower signal value are indicated with dotted lines. In contrast, as shown in FIG. 15, in the image corresponding to the diastole, both the veins and the arteries are rendered as bright blood having the higher signal value. This is because, during diastole, the flow rates of both the veins and the arteries are low. In FIG. 15, for the sake of convenience in the explanation, "bright blood" generally rendered in white is indicated by diagonal-line patterns.

Accordingly, the image generating unit 136 generates an image rendering only the arteries, by performing a difference calculating process for each of the pixels between the image corresponding to the systole and the image corresponding to the diastole. During the difference calculating process, weights may be applied as necessary. Furthermore, the difference calculating process does not necessarily have to be performed between the images, but may be performed between pieces of k-space data.

When a FASE scan is used as the preparatory scan or the imaging scan, for example, the sequence controlling unit 120 acquires, with respect to the diastole, the k-space data for the central part while satisfying PIF=2 and acquires the k-space data for a peripheral part only on one side while satisfying PIF=4. Further, with respect to the diastole, the image generating unit 136 obtains k-space data that is arranged in the peripheral parts on both sides while satisfying PIF=4 and arranged in the central part while satisfying PIF=2, by estimating the k-space data for the peripheral part on the opposite side while using the k-space data actually acquired. During the estimation process, there is a possibility that a positional error may occur in the phase encoding direction. In that situation, the image generating unit 136 may perform a correction.

Further, in the third embodiment, the example is explained in which the acquisition of the echo signals during the systole and the acquisition of the echo signals during the diastole are performed in mutually the same TR; however, the exemplary embodiments are not limited to this example. For example, the sequence controlling unit 120 may perform the acquisition of the echo signals during the systole and the acquisition of the echo signals during the diastole in mutually-different TRs, respectively. Further, the sequence controlling unit 120 may acquire the echo signals during the diastole corresponding to a plurality of slice encodes, after acquiring the echo signals during the systole corresponding to a plurality of slice encodes.

Other Form of the Third Embodiment

In the third embodiment, the example was explained in which the echo signals during the systole and the diastole are acquired while using the two R-R periods as the TR; however, the exemplary embodiments are not limited to this example. It is acceptable to acquire the echo signals during the systole and the diastole while using three or more R-R periods or one R-R period as the TR.

Figure 16:
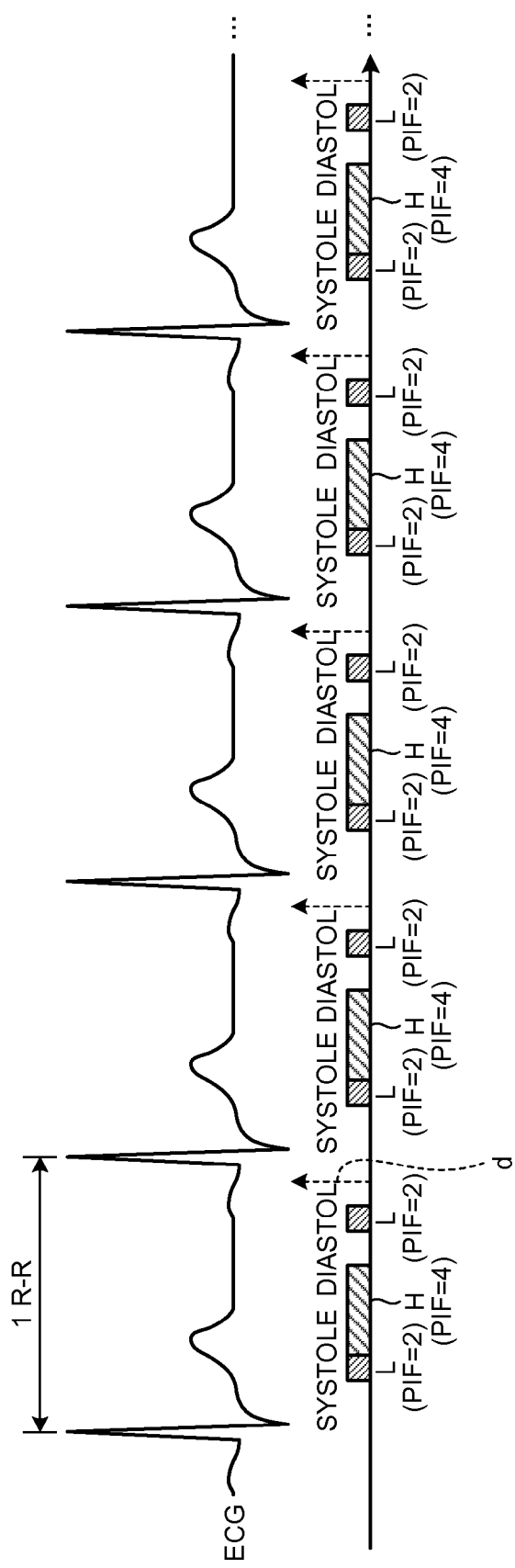
FIG. 16 is a drawing for explaining an imaging scan according to a modification example of the third embodiment.

FIG. 16 is a drawing for explaining an imaging scan according to a modification example of the third embodiment. For example, when a predetermined delay period has elapsed since a peak of the R-wave, the sequence controlling unit 120 first acquires, in a continuous manner without any waiting time, the echo signals during systole to be arranged into the entire region of the k-space while changing the PIF from PIF=2 to PIF=4, by using the centric order method or the scroll order method. Subsequently, when the predetermined delay period has elapsed again, the sequence controlling unit 120 acquires the echo signals during diastole to be arranged into the central part of the k-space while satisfying PIF=2. In other words, in the present modification example of the third embodiment, the sequence controlling unit 120 acquires the echo signals only for the central part with respect to the diastole and acquires the echo signals for the entire region with respect to the systole. To generate an image corresponding to the diastole, the echo signals for the peripheral part acquired with respect to the systole are substitutionally used. When one R-R period is used as the TR, it is considered difficult to completely acquire all the echo signals during diastole due to the relationship with the subsequent R wave. For this reason, the present modification example of the third embodiment is configured so that the echo signals for only the central part are acquired with respect to the diastole. Further, in that situation, as shown with the reference character "d" in FIG. 16, it is desirable to apply a flip back pulse (e.g., T2 plus) after the echo signals during the systole and the diastole are acquired. Like in the third embodiment, it is also acceptable to modify the order in which the acquisitions are performed and the like in the present modification example.

As explained above, according to the third embodiment, it is possible to improve the image quality while performing the high-speed image taking process, like in the first embodiment. More specifically, according to the third embodiment, the PIF is increased for at least the peripheral part of the k-space, and the echo signals for only the central part are acquired with respect to either the systole or the diastole. As a result, the time period required by acquiring the echo signals corresponding to one slice encode is shortened. It is therefore possible to expect impacts of movements and signal blurs to decrease. Further, because the k-space data is acquired at the relatively smaller intervals for the central part of the k-space, it is possible to prevent the SNR from dropping. Furthermore, when the acquisition period of the echo signals is shortened, it is also possible to use one R-R period as the TR as described in the modification example. It is therefore possible to further shorten the image taking period.

Fourth Embodiment

In a fourth embodiment, on the assumption that the MRI apparatus 100 having the same configuration as that in the first embodiment is used, an example will be explained as an application utilization example where a bloodstream image of a lower extremity is taken without a contrast enhancement so as to generate a "moving picture" of bloodstream images in which arteries and veins are separated. This utilization example may be referred to as "Time-Resolved MR Angiography (MRA)" using (artery-and-vein-separated) FBI. More specifically, in the fourth embodiment, an ECG-synchronized three-dimensional FSE scan is used as an imaging scan.

The exemplary embodiments are not limited to the example described above. The image taking target is not limited to a bloodstream image of a lower extremity. For example, other sites such as the head, a lung field, the abdomen, the heart, or the like may be used. Also, the image may be an image of other fluids such as cerebrospinal fluid or lymph fluid. Further, the exemplary embodiments are not limited to the example involving an ECG synchronization. For example, a respiratory synchronization may be used. Alternatively, an ECG synchronization and a respiratory synchronization may be used in combination. Further, the imaging scan does not necessarily have to be an FSE scan. For example, an FASE scan combining a half-Fourier method with an FSE scan or EPI may be used.

In the fourth embodiment, an example will be explained in which no preparatory scan is performed; however, the exemplary embodiments are not limited to this example. In other words, in the fourth embodiment, as explained later, echo signals corresponding to a plurality of cardiac phases are acquired while varying a delay increase amount in such a section of one R-R period where the signal value of the arteries radically fluctuates. Thus, for example, for the purpose of identifying such a section, it is acceptable to perform a preparatory scan to acquire echo signals with a relatively rough increase amount with respect to the one entire R-R period and to identify the section in which the signal value of the arteries radically fluctuates based on the generated images.

Figure 17:
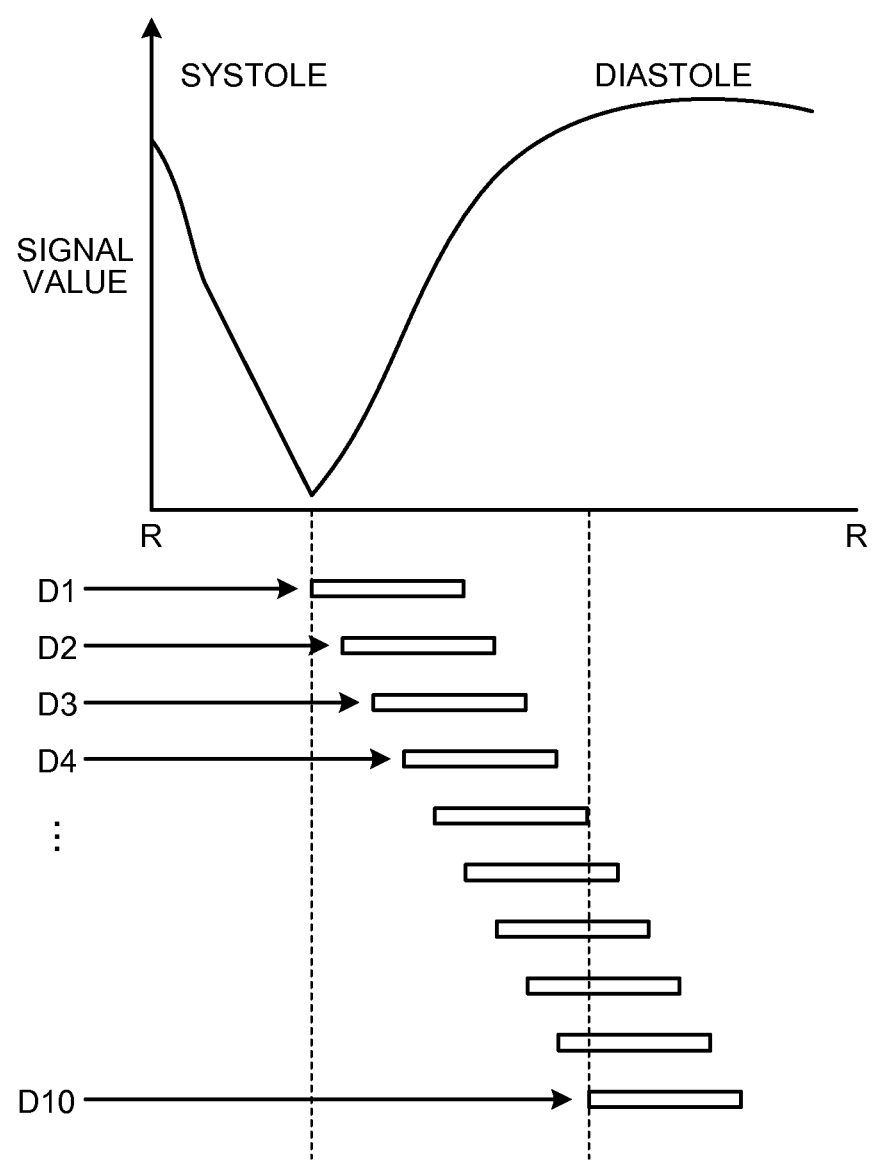
FIG. 17 is a drawing for explaining a fluctuation in a signal value of arteries according to a fourth embodiment.

FIG. 17 is a drawing for explaining a fluctuation in the signal value of the arteries according to the fourth embodiment. The vertical axis expresses the signal value of the arteries, whereas the horizontal axis expresses cardiac phases in one R-R period. As explained also in the third embodiment, because, during systole, the flow rate of the arteries is higher than the flow rate of the veins, which flow at a lower speed, the signal value of the arteries is low. In contrast, during diastole, the flow rate of the arteries also becomes low, and the signal value thereof becomes high. FIG. 17 illustrates this fluctuation and indicates that the fluctuation is particularly radical in the section (hereinafter, "section of interest") marked with two dotted lines.

Accordingly, in the fourth embodiment, to obtain a moving picture of the section of interest, the sequence controlling unit 120 divides the cardiac phases during the section of interest into a predetermined number of partial sections and acquires echo signals for each of the divided cardiac phases. For example, let us assume that one R-R period is 650 msec to 1300 msec, whereas the section of interest is 200 msec. For example, the sequence controlling unit 120 divides the section of interest having the length of 200 msec into ten partial sections and controls the execution of a pulse sequence in such a manner that the increase amount in the delay periods since the peak of the R-wave is equal to 20 msec.

Figure 18:
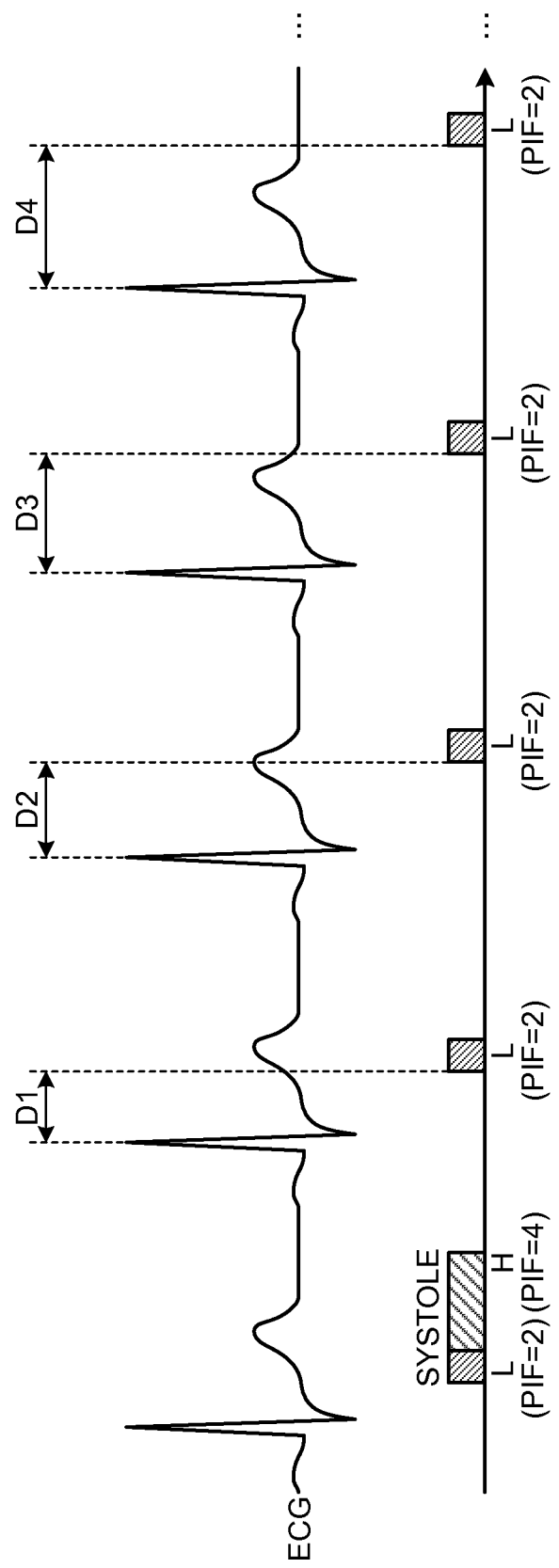
FIG. 18 is a drawing for explaining an imaging scan according to the fourth embodiment.

FIG. 18 is a drawing for explaining an imaging scan according to the fourth embodiment. In the first R-R period, for example, when the predetermined delay period has elapsed since a peak of the R-wave, the sequence controlling unit 120 continuously acquires, without any waiting time, the echo signals during systole to be arranged into the entire region of the k-space while changing the PIF from PIF=2 to PIF=4, by using the centric order method or the scroll order method. Subsequently, in each of the R-R periods, the sequence controlling unit 120 acquires the echo signals corresponding to the cardiac phases to be arranged into the central part of the k-space while satisfying PIF=2, while increasing the delay period since a peak of the R-wave by 20 msec at a time. For example, when a delay period "D1" is compared with a delay period "D2", the delay period "D2" is longer than the delay period "D1" by 20 msec. In this manner, the sequence controlling unit 120 acquires the echo signals only for the central part with respect to the cardiac phases in the section of interest and acquires the echo signals for the entire region with respect to the systole. As explained later, to generate an image corresponding to the cardiac phases, the echo signals for the peripheral part acquired with respect to the systole are substitutionally used.

In the fourth embodiment, the example will be explained in which the echo signals during the systole are acquired with respect to the entire region of the k-space so that the echo signals can substitutionally be used in the generation of the images corresponding to the cardiac phases in the section of interest; however, the exemplary embodiments are not limited to this example. It is also acceptable to acquire the echo signals during the diastole with respect to the entire region of the k-space so that the echo signals can substitutionally be used in the generation of the images corresponding to the cardiac phases. Further, in the fourth embodiment, as shown in FIG. 18, the example using the centric order method or the scroll order method is explained; however, the exemplary embodiments are not limited to this example. As explained in the first embodiment, the exemplary embodiments are similarly applicable to a situation where the sequential order method is used.

The echo signals acquired in this manner are subsequently arranged into the k-space and serve as processing targets of the image generating unit 136. Like in the first embodiment described above, the image generating unit 136 may implement, as the PI method used for generating the images, the method to which the SENSE-based technique is applied, the method to which GRAPPA is applied, the method combining GRAPPA and SENSE, or the like.

Figure 19:
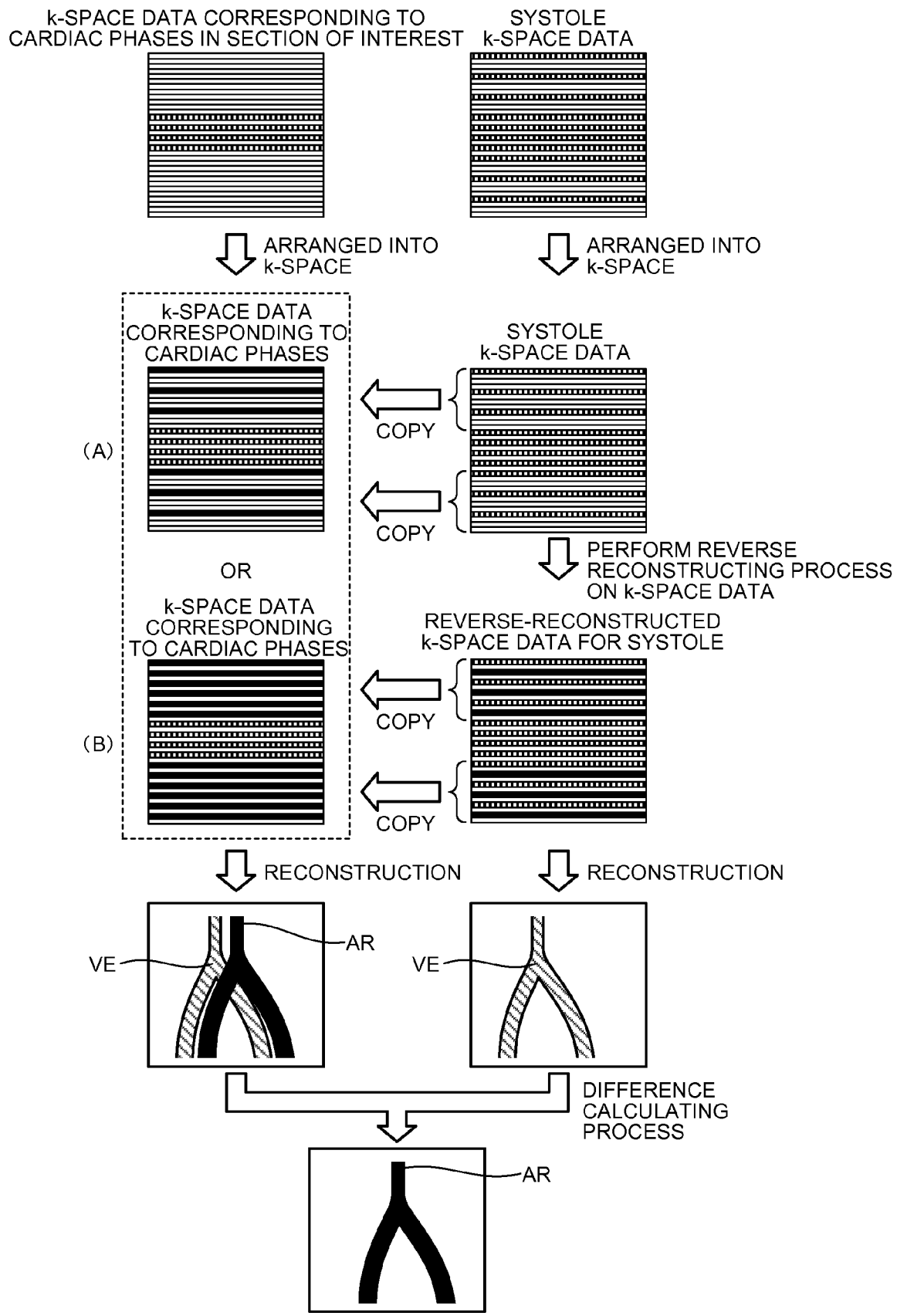
FIG. 19 is a drawing for explaining an example of an image generating process according to the fourth embodiment.

FIG. 19 is a drawing for explaining an example of an image generating process according to the fourth embodiment. FIG. 19 illustrates a method to which the SENSE-based technique is applied. Further, for the sake of convenience in the explanation, two-dimensional k-space data and two-dimensional images are used in the explanation with reference to FIG. 19; however, as mentioned above, when three-dimensional k-space data is acquired in an imaging scan, a three-dimensional image is typically generated from the three-dimensional k-space data.

As shown in FIG. 19, the k-space data corresponding to the cardiac phases in the section of interest is arranged satisfying PIF=2 only in the central part. In contrast, the k-space data during the systole is arranged satisfying PIF=4 in the peripheral part and is arranged satisfying PIF=2 in the central part. In FIG. 19, the patterns marked with vertical stripes indicate k-space data actually acquired.

The image generating unit 136 generates images corresponding to the cardiac phases in the section of interest and to the systole. For example, the image generating unit 136 generates the images corresponding to the systole by performing processes (a) through (g) explained with reference to FIGS. 3A and 3B on the k-space data during the systole. Further, to generate the images corresponding to the cardiac phases in the section of interest, the image generating unit 136 substitutionally uses (e.g., copies) the k-space data during the systole. In this situation, from the aspect of the stage at which the k-space data during the systole is substitutionally used, two methods are possible, like in the third embodiment. In FIG. 19, the patterns marked solid indicate k-space data that is generated by copying or by performing a reverse reconstructing process.

Because the methods are the same as those described in the third embodiment, the explanation will be brief. One of the possible methods is, as shown in FIG. 19(A), a method by which the "k-space data actually acquired" during the systole is copied so as to be filled in as the k-space data for the peripheral part corresponding to the cardiac phases. The other possible method is, as shown in FIG. 19(B), a method by which k-space data satisfying PIF=2 is generated with respect to the systole, and subsequently, the k-space data for the peripheral part is copied so as to be filled in as k-space data for the peripheral part corresponding to the cardiac phases.

After that, the image generating unit 136 generates images rendering only the arteries, by performing a difference calculating process for each of the pixels between the images corresponding to the cardiac phases and the images corresponding to the systole. During the difference calculating process, weights may be applied as necessary. The difference calculating process does not necessarily have to be performed between images, but may be performed between pieces of k-space data.

In this situation, as shown in FIG. 19, in the image corresponding to the systole, the veins are rendered as bright blood (white) having a higher signal value, whereas the arteries are rendered as bright blood having a lower signal value. In contrast, in the images corresponding to the cardiac phases in the section of interest, the veins are rendered as bright blood having a higher signal value, whereas the arteries are rendered as bright blood having a gradually-increased signal value, because the signal value gradually increases from the systole toward the diastole. (FIG. 19 illustrates images corresponding to one cardiac phase). In FIG. 19, for the sake of convenience in the explanation, "bright blood" generally rendered in white is colored in black.

Figure 20:
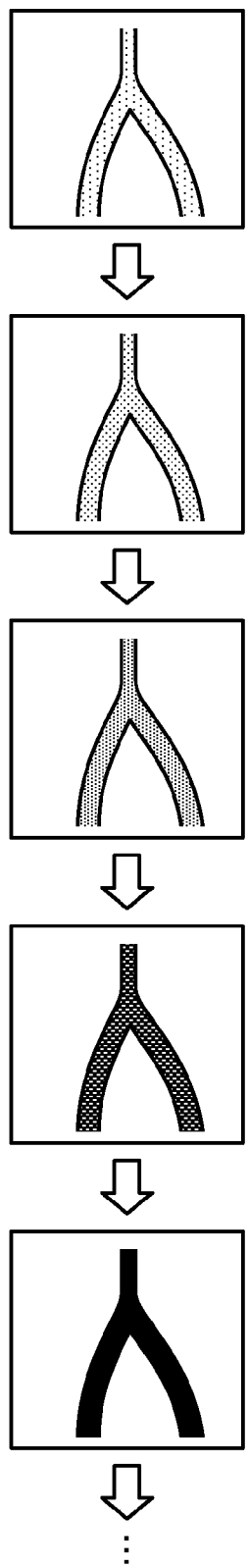
FIG. 20 is a drawing for explaining an example of a moving picture according to the fourth embodiment.

FIG. 20 is a drawing for explaining an example of a moving picture according to the fourth embodiment. As shown in FIG. 20, the image generating unit 136 according to the fourth embodiment is able to generate a moving picture in which the arteries are gradually rendered as bright blood having a higher signal value. In FIG. 20, for the sake of convenience in the explanation, "bright blood" is colored in black and a gradual increase in the signal value is indicated by gradually-darkened black. Incidentally, generally speaking, "bright blood" means rendering of the veins and the arteries in white relative to background signals. In this case, the arteries are rendered so as to gradually become whiter and distinguished along with a gradual increase in the signal value from the systole toward the diastole.

Other Form of the Fourth Embodiment

In the fourth embodiment, the example was explained in which the echo signals corresponding to the cardiac phases in the section of interest are acquired in the mutually different R-R periods; however, the exemplary embodiments are not limited to this example. It is acceptable to acquire the echo signals corresponding to the plurality of cardiac phases in one R-R period.

Figure 21:
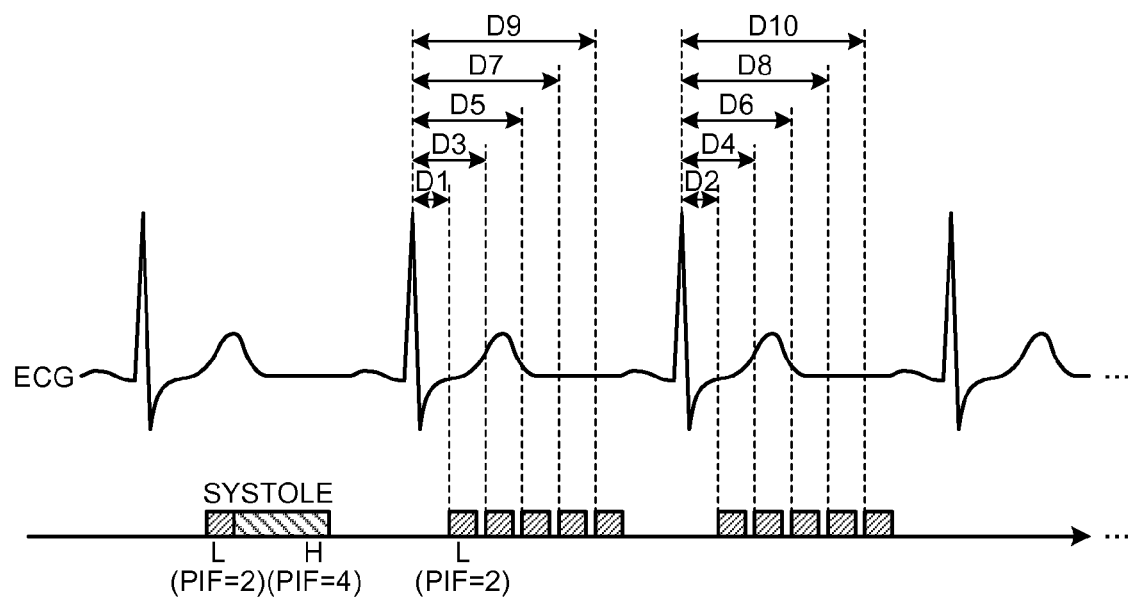
FIG. 21 is a drawing for explaining an imaging scan according to a modification example of the fourth embodiment.

FIG. 21 is a drawing for explaining an imaging scan according to a modification example of the fourth embodiment. Like in the fourth embodiment, in the first R-R period, for example, when a predetermined delay period has elapsed since a peak of the R-wave, the sequence controlling unit 120 continuously acquires, without any waiting time, the echo signals during systole to be arranged into the entire region of the k-space while changing the PIF from PIF=2 to PIF=4, by using the centric order method or the scroll order method. Subsequently, in the subsequent R-R period, the sequence controlling unit 120 acquires the echo signals corresponding to a delay period "D1", a delay period "D3", a delay period "D5", a delay period "D7", and a delay period "D9" while satisfying PIF=2. Further, in the subsequent R-R period, the sequence controlling unit 120 acquires the echo signals corresponding to a delay period "D2", a delay period "D4", a delay period "D6", a delay period "D8", and a delay period "D10" while satisfying PIF=2. When the acquisition period of the echo signals corresponding to the cardiac phases is longer than the time resolution (e.g., 20 msec), it is appropriate to alternately assign the acquisitions corresponding to the cardiac phases to the plurality of R-R periods, as described above.

Further, in the present modification example of the fourth embodiment, as shown in FIG. 21, the example using the centric order method or the scroll order method is explained; however, the exemplary embodiments are not limited to this example. As explained in the first embodiment, the exemplary embodiments are similarly applicable to a situation where the sequential order method is used.

The assignment of the cardiac phases shown in FIG. 21 is merely an example. For example, if the acquisition period is shorter than the time resolution, it is acceptable to serially acquire as many echo signals corresponding to the cardiac phases as possible in each of the R-R periods. For example, in one R-R period, the sequence controlling unit 120 may serially acquire the echo signals corresponding to the delay period "D1" to the delay period "D10", while satisfying PIF=2.

As explained above, according to the fourth embodiment, it is possible to improve the image quality while performing the high-speed image taking process, like in the first embodiment. More specifically, according to the fourth embodiment, it is possible to acquire the echo signals while arranging the increase amounts in the delay periods to be small (e.g., 10 msec to 20 msec), from the systole to the diastole where the signal difference is present. It is therefore possible to obtain the images having less blurs. Further, as described in the modification example, it is also possible to acquire the echo signals corresponding to the plurality of cardiac phases in one R-R period. It is therefore possible to shorten the image taking period. The exemplary embodiments are not limited to the fourth embodiment and the modifications described above. For example, the sequence controlling unit 120 may acquire the echo signals arranged in the entire region of the k-space not only in the first R-R period but also in the second and later R-R periods.

Fifth Embodiment

In a fifth embodiment, on the assumption that the MRI apparatus 100 having the same configuration as that in the first embodiment is used, an example will be explained as an application utilization example where a moving picture of bloodstream images of the heart is taken without a contrast enhancement. This utilization example corresponds to a method by which a fluid flowing in or flowing out to an image taking region is labeled and may be referred to as a "Time-Spatial Labeling Inversion Pulse (Time-SLIP)" method. More specifically, in the fifth embodiment, an ECG-synchronized three-dimensional FSE is used as an imaging scan.

The exemplary embodiments are not limited to the example described above. The method according to the fifth embodiment is applicable to not only taking a moving picture but also taking a still image. Further, the image taking target is not limited to a bloodstream image of the heart. For example, other sites such as the head, a lung field, the abdomen, a lower extremity, or the like may be used. Also, the image may be an image of other fluids such as cerebrospinal fluid or lymph fluid. Further, the exemplary embodiments are not limited to the example involving an ECG synchronization. For example, a respiratory synchronization may be used. Alternatively, an ECG synchronization and a respiratory synchronization may be used in combination. Further, the imaging scan does not necessarily have to be an FSE scan. For example, an FASE scan combining a half-Fourier method with an FSE scan or bSSFP may be used.

Further, in the fifth embodiment, an example will be explained in which no preparatory scan is performed; however, the exemplary embodiments are not limited to this example. Like in the fourth embodiment, it is acceptable to perform a preparatory scan to acquire echo signals with a relatively rough increase amount with respect to the one entire R-R period and to identify a section of interest in which the signal value of the arteries radically fluctuates based on the generated images.

First, the Time-SLIP method will be briefly explained. According to the Time-SLIP method, a fluid flowing in or flowing out to an image taking region is labeled within a labeled region that is independent of the image taking region. For example, the labeled region can be set in an aorta positioned upstream of a myocardium. As a result, the signal value of the fluid flowing in to the image taking region or flowing out to the image taking region after a predetermined period of time is relatively higher or lower, and the fluid is thus rendered. The predetermined period of time may be referred to as a Black-Blood Time to Inversion (BBTI) period.

Figure 22:
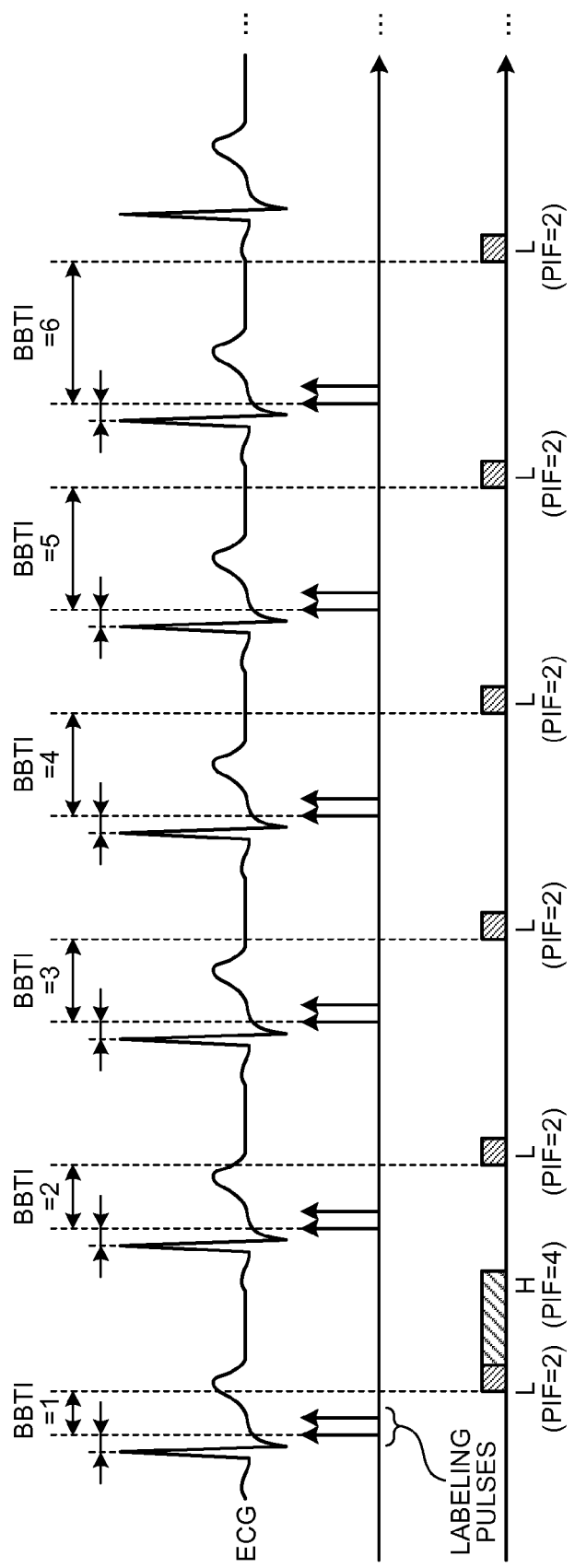
FIG. 22 is a drawing for explaining an imaging scan according to a fifth embodiment.

FIG. 22 is a drawing for explaining an imaging scan according to the fifth embodiment. As for the pulse sequence shown in FIG. 22, only labeling pulses are shown for the sake of convenience in the explanation. The indications such as "BBTI=1" to "BBTI=6" indicate that the BBTI period i.e., the elapsed time period since the application of a labeling pulse gradually increases.

For example, when a predetermined delay period has elapsed since a peak of the R-wave, the sequence controlling unit 120 applies a non-region-selecting inversion pulse and a region-selecting inversion pulse as the labeling pulses. Normally, the non-region-selecting inversion pulse is applied to the entire image taking region, whereas the region-selecting inversion pulse is applied to the labeled region. It is possible to select whether the non-region-selecting inversion pulse is to be applied or not depending on how the signals should be rendered.

A typical example will be explained. For instance, let us discuss a situation where the labeled region is set in the image taking region. First, when the sequence controlling unit 120 has applied a non-region-selecting inversion pulse to the entire image taking region, the longitudinally magnetized components of the tissues in the entire image taking region are reversed. Subsequently, the sequence controlling unit 120 applies a region-selecting inversion pulse to only the labeled region in the image taking region. As a result, the longitudinally magnetized components of the tissues in the labeled region are reversed again. When a BBTI period has elapsed since this application, the tissues to which only the non-region-selecting inversion pulse was applied (i.e., the tissues other than the labeled tissues) recover, and the longitudinally magnetized components thereof become zero (a null point). For example, the sequence controlling unit 120 acquires the echo signals at that time. As a result, only the labeled fluid is visualized with a higher signal value. Because the labeled fluid flows out to the image taking region, the term "flow out" may be used.

As another example, let us discuss a situation where the labeled region is set outside the image taking region. When the sequence controlling unit 120 has applied a region-selecting inversion pulse only to the labeled region outside the image taking region, the longitudinally magnetized components of the tissues in the labeled region are reversed. Although the labeled fluid subsequently flows into the image taking region, because no inversion pulse has been applied to the tissues in the image taking region, there are differences in the longitudinally magnetized components between the fluid and the tissues in the image taking region. When a BBTI period has elapsed, the sequence controlling unit 120 acquires the echo signals. As a result, only the labeled fluid is visualized with a lower signal value. Because the labeled fluid flows in to the image taking region, the term "flow in" may be used.

Alternatively, the sequence controlling unit 120 may employ a pulsed Continuous Arterial Spin Labeling (pCASL) method by which labeling pulses are continuously emitted. Further, the position and the number of labeled regions may be arbitrarily modified. Further, as the labeling pulses, it is also acceptable to use an Inversion Recovery (IR) pulse, a saturation (SAT) pulse, a Spatial Modulation of Magnetization (SPAMM) pulse, a DANTE pulse, or the like. The SAT pulse is configured to saturate longitudinally magnetized components by turning the magnetization vector in a labeled region by 90 degrees. By adjusting the gradient magnetic field, the SPAMM pulse and the DANTE pulse form a region that is saturated with a desired pattern such as a stripe pattern, a grid pattern, a radial pattern, or the like.

As shown in FIG. 22, for example, in the first R-R period, when a predetermined delay period (e.g., BBTI=1) has elapsed since a peak of the R-wave, the sequence controlling unit 120 continuously acquires, without any waiting time, the echo signals to be arranged into the entire region of the k-space while changing the PIF from PIF=2 to PIF=4, by using the centric order method or the scroll order method. Subsequently, in each of the R-R periods, the sequence controlling unit 120 acquires the echo signals corresponding to the cardiac phases to be arranged into the central part of the k-space while satisfying PIF=2, while gradually increasing the delay period since a peak of the R-wave. As explained herein, in the fifth embodiment, the sequence controlling unit 120 acquires the echo signals for the entire region with respect to the one BBTI period and acquires the echo signals only for the central part with respect to the other BBTI periods. To generate the images corresponding to the BBTI periods, the echo signals for the peripheral part acquired with respect to the one BBTI period are substitutionally used.

In the fifth embodiment, as shown in FIG. 22, the example using the centric order method or the scroll order method is explained; however, the exemplary embodiments are not limited to this example. As explained in the first embodiment, the exemplary embodiments are similarly applicable even to a situation where the sequential order method is used.

Further, it is possible to perform the image generating process according to the fifth embodiment, for example, in the same manner as described in the fourth embodiment. More specifically, for example, the image generating unit 136 generates an image corresponding to "BBTI=1" by performing processes (a) through (g) explained with reference to FIGS. 3A and 3B on the k-space data corresponding to "BBTI=1". Further, to generate the images corresponding to the other BBTI periods, the image generating unit 136 generates k-space data arranged in the entire region of the k-space while satisfying PIF=2 by substitutionally using (e.g., copying) the k-space data corresponding to "BBTI=1". Further, the image generating unit 136 generates the images corresponding to the BBTI periods, by performing processes (e) and (f) explained with reference to FIG. 3B on the k-space data.

Other Form of the Fifth Embodiment

In the fifth embodiment, the example was explained in which the echo signals corresponding to the BBTI periods are acquired in the mutually-different R-R periods, respectively; however, the exemplary embodiments are not limited to this example. It is acceptable to acquire the echo signals corresponding to the plurality of BBTI periods in one R-R period. Further, another method is also possible by which two images are acquired in a single cardiac phase by performing an acquisition involving the labeling process with the region-selecting inversion pulse and an acquisition not involving the labeling process with the region-selecting inversion pulse, so as to extract only the labeled fluid and to suppress background signals by performing a difference calculating process on the two acquired images. This method may further be applied. The difference calculating process does not necessarily have to be performed between images, but may be performed between pieces of k-space data.

Figure 23:
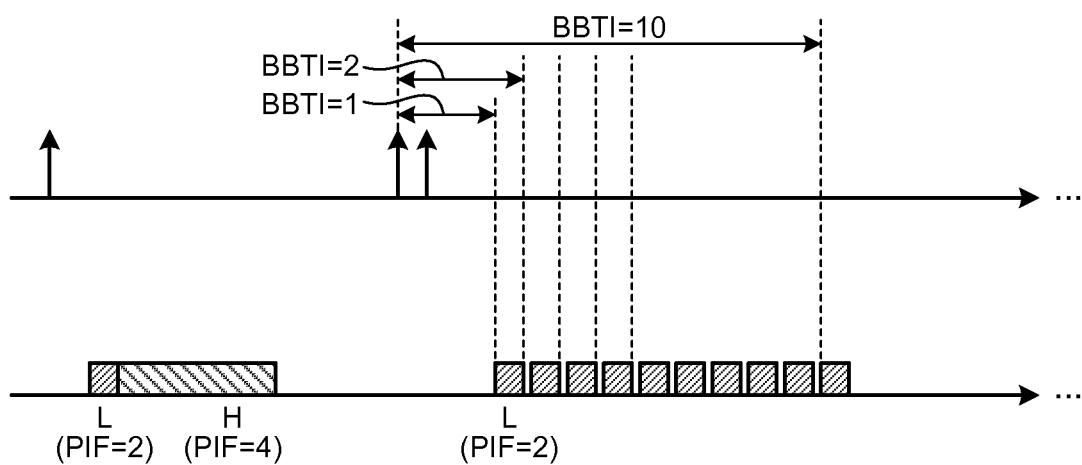
FIG. 23 is a drawing for explaining an imaging scan according to a modification example of the fifth embodiment.

FIG. 23 is a drawing for explaining an imaging scan according to a modification example of the fifth embodiment. In FIG. 23, waveform signals of ECG are omitted. The reason is that ECG is merely a trigger for the applications of the labeling pulses in the Time-SLIP method. Each of the BBTI periods is an elapsed period of time since the application of the labeling pulse.

For example, by applying a non-region-selecting inversion pulse and not applying a region-selecting inversion pulse (i.e., without performing the labeling process), the sequence controlling unit 120 first acquires, in a continuous manner without any waiting time, the echo signals to be arranged into the entire region of the k-space while changing the PIF from PIF=2 to PIF=4, by using the centric order method or the scroll order method. Subsequently, after applying both a non-region selecting inversion pulse and a region-selecting inversion pulse (i.e., after performing the labeling process), the sequence controlling unit 120, at this time, serially acquires pieces of k-space data that correspond to mutually-different BBTI periods and are to be arranged into the central part of the k-space while satisfying PIF=2.

In the present modification example of the fifth embodiment, as shown in FIG. 23, the example using the centric order method or the scroll order method is explained; however, the exemplary embodiments are not limited to this example. As explained in the first embodiment, the exemplary embodiments are similarly applicable even to a situation where the sequential order method is used. Further, the order in which the acquisition without the labeling process and the acquisition with the labeling process are performed may be reversed.

Further, for example, the image generating unit 136 generates images of background signals by performing processes (a) through (g) explained with reference to FIGS. 3A and 3B on the k-space data acquired without the labeling process. Further, to generate images corresponding to the BBTI periods acquired with the labeling process, the image generating unit 136 generates k-space data arranged in the entire region of the k-space while satisfying PIF=2, by substitutionally using (e.g., copying) the k-space data acquired without the labeling process. Further, the image generating unit 136 generates the images corresponding to the BBTI periods by performing processes (e) and (f) explained with reference to FIG. 3B on the k-space data. Subsequently, the image generating unit 136 generates images in which only the labeled fluid is rendered and in which the background signals are suppressed, by performing a difference calculating process for each of the pixels between the background images and the images corresponding to the BBTI periods. During the difference calculating process, weights may be applied as necessary. The difference calculating process does not necessarily have to be performed between images, but may be performed between pieces of k-space data.

As explained above, according to the fifth embodiment, it is possible to improve the image quality while performing the high-speed image taking process, like in the first embodiment. More specifically, according to the fifth embodiment, because it is possible to improve the time resolution in the BBTI periods, it is possible to obtain the images having less blurs. Further, as described in the modification example, it is possible to acquire the echo signals corresponding to the plurality of BBTI periods in one R-R period. It is therefore possible to shorten the image taking period.

Sixth Embodiment

In a sixth embodiment, on the assumption that the MRI apparatus 100 having the same configuration as that in the first embodiment is used, an example will be explained as an application utilization example where images showing hemodynamics of myocardia are taken without an ECG synchronization, while using a contrast enhancement. This utilization example may be referred to as a "myocardial perfusion". The myocardial perfusion is a method by which, after a contrast agent is bolus-injected through a vein, cross-sectional images on a left ventricular minor axis are serially taken at a high speed, so as to obtain T1-weighted images showing temporal changes in the dyeing process of the myocardia.

The exemplary embodiments are not limited to the example described above. The image taking target is not limited to hemodynamics of myocardia. For example, other sites such as the chest, the liver, or the like may be used. Also, the image may be of hemodynamics of other fluids such as cerebrospinal fluid or lymph fluid. The exemplary embodiments are similarly applicable as long as an image taking process is performed while using a contrast enhancement without an ECG synchronization. Further, as the imaging scan, a segmented FFE scan or FFE EPI combining an FFE scan with EPI may be used.

Figure 24:
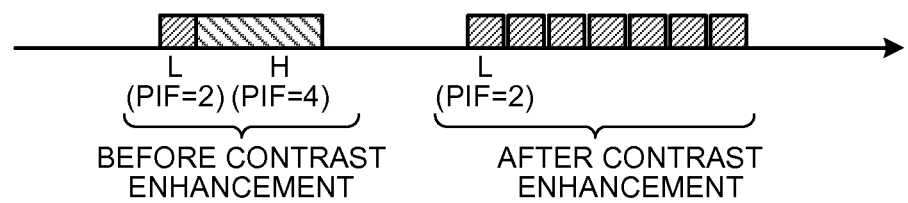
FIG. 24 is a drawing for explaining an imaging scan according to a sixth embodiment.

FIG. 24 is a drawing for explaining an imaging scan according to the sixth embodiment. For example, prior to injection of a contrast agent, the sequence controlling unit 120 first acquires, in a continuous manner without any waiting time, the echo signals to be arranged into the entire region of the k-space, while changing the PIF from PIF=2 to PIF=4, by using the centric order method or the scroll order method. Subsequently, after a contrast agent is injected, the sequence controlling unit 120, at this time, serially acquires the k-space data to be arranged into the central part of the k-space, while satisfying PIF=2.

In the sixth embodiment, as shown in FIG. 24, the example using the centric order method or the scroll order method is explained; however, the exemplary embodiments are not limited to this example. As explained in the first embodiment, the exemplary embodiments are similarly applicable even to a situation where the sequential order method is used. Further, the acquisition described as being performed before the contrast enhancement may be performed after a predetermined period of time has elapsed since the contrast enhancement. Moreover, the acquisition before the contrast enhancement does not necessarily have to be performed while changing the PIF from PIF=2 to PIF=4. For example, it may be possible to perform the acquisition for the entire region of the k-space while satisfying PIF=2 or the acquisition for the entire region of the k-space while satisfying PIF=4. The same applies to a sixth embodiment and modifications explained below.

Further, for example, the image generating unit 136 generates an image prior to the contrast enhancement by performing processes (a) through (g) explained with reference to FIGS. 3A and 3B on the k-space data prior to the contrast enhancement. Further, to generate the images after the contrast enhancement, the image generating unit 136 generates k-space data arranged in the entire region of the k-space while satisfying PIF=2, by substitutionally using (e.g., copying) the k-space data prior to the contrast enhancement. Further, the image generating unit 136 generates the images after the contrast enhancement by performing processes (e) and (f) explained with reference to FIG. 3B on the k-space data. Subsequently, the image generating unit 136 generates images in which only contrast-enhanced blood vessels are rendered, by performing a difference calculating process for each of the pixels between the image prior to the contrast enhancement and the images after the contrast enhancement. During the difference calculating process, weights may be applied as necessary. The difference calculating process does not necessarily have to be performed between images, but may be performed between pieces of k-space data.

Other Forms of Sixth Embodiment

Figure 25:
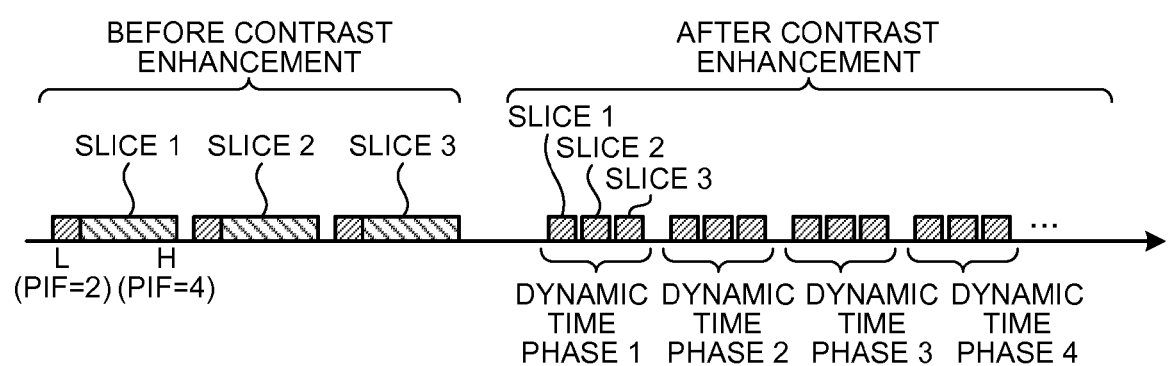
FIG. 25 is a drawing for explaining an imaging scan according to a first modification example of the sixth embodiment.

FIG. 25 is a drawing for explaining an imaging scan according to a first modification example of the sixth embodiment. FIG. 25 illustrates an example in which multi-slice images on a left ventricular minor axis are serially taken at a high speed. As shown in FIG. 25, for example, prior to injection of a contrast agent, the sequence controlling unit 120 first acquires, in a continuous manner without any waiting time, the echo signals to be arranged into the entire region of the k-space, with respect to each of the slices (e.g., slices 1, 2, and 3) while changing the PIF from PIF=2 to PIF=4, by using the centric order method or the scroll order method. Subsequently, after a contrast agent is injected, the sequence controlling unit 120, at this time, serially acquires the k-space data to be arranged into the central part of the k-space with respect to each of the slices, while satisfying PIF=2. The serial acquisition may be referred to as a "dynamic image taking process", whereas the time phases may be referred to as "dynamic time phases". As shown in FIG. 25, the sequence controlling unit 120 serially acquires the k-space data corresponding to the slices for each of the dynamic time phases. For example, with respect to dynamic time phase 1, the sequence controlling unit 120 acquires k-space data corresponding to slices 1 to 3. Subsequently, with respect to dynamic time phase 2, the sequence controlling unit 120 acquires k-space data corresponding to slices 1 to 3.

FIG. 26 is a drawing for explaining an imaging scan according to a second modification example of the sixth embodiment. FIG. 26 illustrates an example in which, in contrast to the example shown in FIG. 24, the k-space data after injection of a contrast agent is acquired by using an ECG synchronization. More specifically, the sequence controlling unit 120 acquires the k-space data to be arranged into the central part of the k-space while satisfying PIF=2 when, for example, a predetermined delay period has elapsed since a peak value of the R-wave in the ECG signal in each of R-R periods after the injection of the contrast agent. The other configurations are the same as those in the sixth embodiment.

FIG. 27 is a drawing for explaining an imaging scan according to a third modification example of the sixth embodiment. FIG. 27 illustrates an example in which, in contrast to the example shown in FIG. 25, the k-space data corresponding to each of the dynamic time phases after the injection of the contrast agent is acquired by using an ECG synchronization. More specifically, the sequence controlling unit 120 acquires the k-space data corresponding to each of the dynamic time phases while satisfying PIF=2 when, for example, a predetermined delay period has elapsed since a peak value of the R-wave in the ECG signal in each of R-R periods after the injection of the contrast agent. The time phases of the slices 1, 2, and 3 coincide in a plurality of R-R periods. The other configurations are the same as those in the first modification example of the sixth embodiment.

As explained above, according to the sixth embodiment and the modification examples thereof, it is possible to improve the image quality while performing the high-speed image taking process, like in the first embodiment. More specifically, according to the sixth embodiment, because it is possible to improve the time resolution, it is possible to obtain the images having less blurs. Further, it is possible to shorten the image taking period.

Other Embodiments

Possible embodiments are not limited to the exemplary embodiments described above.

The exemplary embodiments described above include the situations explained as general-purpose imaging scans (or preparatory scans) and the situations explained as application utilization examples; however, the examples are not limited to these categories. For example, it is acceptable to apply any of the phase encoding patterns explained in the general-purpose aspects in the first embodiment, to any of the applications described in the second and later embodiments. Conversely, it is acceptable to treat any of the patterns described as the application utilization examples in the second and later embodiments, as a general-purpose pattern that is applicable to other applications. The same applies to the patterns explained as the modification examples of the embodiments.

Further, the exemplary embodiments are not limited to the situations explained in the embodiments and the modification examples thereof where the specific image taking target and the specific type of pulse sequence are specified. Other image taking targets and other types of pulse sequences are also applicable. Further, it is also acceptable to add a flip back pulse or the like as necessary to any of the exemplary embodiments.

<Methods for Generating the Images>

The exemplary embodiments above are explained while indicating that, as the PI method used for generating the images, the method to which the SENSE-based technique is applied, the method to which GRAPPA is applied, the method combining GRAPPA and SENSE, or the like is applicable; however, the exemplary embodiments are not limited to these methods. It is acceptable to generate the images by using other methods. In that situation, for example, the image generating unit 136 generates the MR image based on the k-space data arranged in the k-space by the arranging unit 133a, information on the sensitivity of each of the channels, combinations of pieces of separately-given knowledge data, or a part of the combinations.

<Switching Between TRs>

In the exemplary embodiments described above, the example is explained in which, when the slice encodes, the slices, or the segments are repeatedly acquired in each of the TRs, the phase encodes serving as the acquisition targets are not particularly changed; however, the exemplary embodiments are not limited to this example. Even if the same PIF such as PIF=4 or PIF=2 is used, it is acceptable to perform the acquisitions while changing the phase encodes serving as the acquisition targets by, for example, acquiring even-numbered phase encodes in one TR and acquiring odd-numbered phase encodes in the subsequent TR.

Further, in the exemplary embodiments described above, the example is explained in which the range of phase encodes regarded as "the central part of the k-space" is constant among the TRs; however, the exemplary embodiments are not limited to this example. For instance, when the k-space data on the side to be substitutionally used (e.g., to be copied) is acquired, it is acceptable to set the range of the central part (e.g., the range acquired while satisfying PIF=2) so as to be slightly wider. Conversely, when the k-space data on the side to use the substitution (e.g., the side onto which the k-space data is copied) is acquired, it is acceptable to set the range of the central part so as to be slightly wider.

Further, in the sixth embodiment described above, the example in which the images are taken with the contrast enhancement was explained. Such a contrast enhancement may concern both the times at which a time resolution should be prioritized and the times at which a spatial resolution should be prioritized. For example, after a contrast agent is injected, the data is acquired with a high time resolution, and subsequently, the data of an internal organ such as the liver is acquired with a spatial resolution. In that situation, it is acceptable to acquire the data while changing the PIF over the course of time after the injection of the contrast agent.

When the pieces of k-space data corresponding to mutually-different time phases are acquired in the different TRs, as indicated in the patterns shown in FIGS. 18 and 22, it is acceptable to, for example, arrange the width of the range acquired while satisfying PIF=2 to be variable, depending on the remaining time period until a subsequent R-wave. When the width is variable, it is acceptable to adjust the width in such a manner that the recovery of the magnetization coincides. Alternatively, it is acceptable to apply a flip back pulse. Furthermore, another arrangement is also acceptable in which, after k-space data that can be acquired in each of the TRs is temporarily acquired, the image generating unit 136 generates images by eliminating such k-space data that is not usable in the image generating process.

<Specific Numeric Values and Specific Order of the Processes>

The specific numeric values and the specific order of the processes described in the exemplary embodiments above are, in principle, only examples. For instance, it is acceptable to arbitrarily modify any of the following: the PIFs, the number of types of intervals, the direction in which the downsampling process is performed, the size of the k-space, the number of segments, the increase amounts in the delay periods, and the number of cardiac phases used in the acquisition of the moving picture. Further, it is also acceptable to arbitrarily modify the order of the processes by, for example, performing certain processes in parallel if it is acceptable to perform those processes in parallel.

For example, the time at which the k-space data is arranged into the first region of the k-space so as to be positioned at the first intervals does not necessarily have to be the same as the time at which the k-space data is arranged into the second region so as to be positioned at the second intervals. For example, when a pattern is used where the k-space data to be arranged at the second intervals is antecedently acquired, it is sufficient if, in the k-space at a certain stage, the k-space data has been arranged in the second region thereof so as to be positioned at the second intervals. In other words, at that stage, the k-space data positioned at the first intervals does not necessarily have to be arranged in the first region of the k-space. At that stage, the image generating unit 136 is able to perform the process of generating the k-space data at the first intervals from the k-space data positioned at the second intervals. The sequence controlling unit 120 and the arranging unit 133a may perform the process of acquiring and arranging the k-space data into the first region so as to be positioned at the first intervals in parallel with the process performed by the image generating unit 136. When those processes are performed in parallel, it is possible to shorten the entire processing time period from the acquisition to the MR image generating process. Further, the exemplary embodiments include a situation where the k-space in which the k-space data is arranged so as to be positioned at the first intervals and the k-space in which the k-space data is arranged so as to be positioned at the second intervals are not mutually the same k-space.

Furthermore, in the situations where the k-space data corresponding to the systole (or the diastole) is antecedently acquired and arranged, where the k-space data corresponding to "BBTI=1" is antecedently acquired and arranged, and where the k-space data corresponding to the time prior to the contrast enhancement is antecedently acquired and arranged, the image generating unit 136 may start the MR image generating process by using the k-space data that is antecedently acquired and arranged.

<Image Processing System>

In the exemplary embodiments above, the examples are explained in which the MRI apparatus 100 serving as a medical image diagnosis apparatus performs the various types of processes; however, the exemplary embodiments are not limited to these examples. For example, another arrangement is acceptable in which an image processing system including the MRI apparatus 100 and an image processing apparatus performs the various types of processes described above. In this situation, the image processing apparatus may be, for example, a workstation, an image storing apparatus (an image server) and a viewer used in a Picture Archiving and Communication System (PACS), or various types of apparatuses used in an electronic medical record system. In that situation, for example, the MRI apparatus 100 implements the acquisitions performed by the sequence controlling unit 120. In contrast, the image processing apparatus receives the MR data and the k-space data acquired by the MRI apparatus 100 from the MRI apparatus 100 or from the image server via a network or from an input made by the operator via a recording medium and stores the received MR data and the received k-space data into a storage unit. Further, the image processing apparatus can perform the various types of processes described above (e.g., the process performed by the arranging unit 133a and the process performed by the image generating unit 136), while using the MR data and the k-space data stored in the storage unit as the processing target.

<Computer Programs>

The instructions indicated in the processing procedures described in the exemplary embodiments above may be executed based on a computer program (hereinafter, "the program") realized with software. By configuring a general-purpose computer so as to store therein the program in advance and to read the stored program, it is also possible to achieve the same advantageous effects as those with the MRI apparatus 100 described in the exemplary embodiments above. The instructions described in the exemplary embodiments above are recorded, as a computer-executable program, into a recording medium such as a magnetic disk (a flexible disk, a hard disk, or the like), an optical disk (a Compact Disk Read-Only Memory (CD-ROM), a Compact Disk Recordable (CD-R), a Compact Disk Rewritable (CD-RW), a Digital Versatile Disk Read-Only Memory (DVD-ROM), a Digital Versatile Disk Recordable (DVD±R), a Digital Versatile Disk Rewritable (DVD±RW) or the like), a semiconductor memory, or the like. As long as the computer or an incorporated system is able to read data from the storage medium, any storing format is acceptable. When the computer reads the program from the recording medium and causes the CPU to execute the instructions written in the program based on the program, it is possible to realize the same operations as those performed by the MRI apparatus 100 described in the exemplary embodiments above. Further, when the computer obtains or reads the program, the computer may obtain or read the program via a network.

Furthermore, another arrangement is also acceptable in which, based on the instructions written in the program installed from the storage medium onto a computer or an incorporated system, an Operating System (OS) running in the computer, database managing software, middleware for a network, or the like executes a part of the processes used for realizing the exemplary embodiments described above. Further, the storage medium does not necessarily have to be a medium that is independent of the computer or the incorporated system. Examples of the storage medium include such a storage medium that has stored therein or has temporarily stored therein the downloaded program transmitted via a Local Area Network (LAN), the Internet, or the like. Further, more than one storage medium may be used. As an example of the storage medium according to the exemplary embodiments, the processes in the exemplary embodiments may be executed from a plurality of media. Any configuration is acceptable as the configuration of the medium/media.

The computer or the incorporated system according to the exemplary embodiments is configured to perform the processes described in the exemplary embodiments above based on the program stored in the storage medium. The computer or the incorporated system may be configured with a single apparatus such as a personal computer, a microcomputer, or the like or may be configured with a system in which a plurality of apparatuses are connected together via a network. The computer according to the exemplary embodiments does not necessarily have to be a personal computer and may be an arithmetic processing unit included in an information processing apparatus, a microcomputer, or the like. The term "computer" is used to generally refer to all the devices and apparatuses that are able to realize the functions described in the exemplary embodiments, based on the program.

By using the apparatus and the method for magnetic resonance imaging according to at least one aspect of the exemplary embodiments described above, it is possible to improve the image quality while performing the high-speed image taking process.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
a sequence controlling unit configured to, by controlling an execution of a pulse sequence, acquire magnetic resonance signals corresponding to a plurality of channels in the pulse sequence executed as a series, the magnetic resonance signals being configured to be arranged into a first region of a k-space so as to be positioned at first intervals and into a second region larger than the first region so as to be positioned at second intervals larger than the first intervals;
an arranging unit configured to arrange the magnetic resonance signals corresponding to the plurality of channels into the k-space as k-space data; and
an image generating unit configured to generate k-space data at the first intervals corresponding to the plurality of channels based on the k-space data at the second intervals acquired by the execution of the pulse sequence and generate a magnetic resonance image based on the generated k-space data at the first intervals, the k-space data at the first intervals acquired by the execution of the pulse sequence, and sensitivity distributions corresponding to the plurality of channels.

2. The magnetic resonance imaging apparatus according to claim 1, wherein the sequence controlling unit acquires the magnetic resonance signals corresponding to the plurality of channels so as to be arranged into the first region that is a central part of the k-space so as to be positioned at the first intervals and into the second region including a peripheral part of the k-space so as to be positioned at the second intervals.

3. The magnetic resonance imaging apparatus according to claim 1, wherein
with respect to a first image, the sequence controlling unit acquires magnetic resonance signals to be arranged into an entire region of a k-space with a combination of the first intervals and the second intervals and, with respect to a second image, the sequence controlling unit acquires magnetic resonance signals to be arranged into a central part of a k-space so as to be positioned at the first intervals, and to generate the second image, the image generating unit generates k-space data to be arranged into a peripheral part of the k-space, based on the k-space data that has been acquired with respect to the first image and arranged in the k-space.

4. The magnetic resonance imaging apparatus according to claim 3, wherein the image generating unit copies the k-space data that has been acquired with respect to the first image and arranged in the peripheral part of the k-space corresponding to the first image, as the k-space data to be arranged into the peripheral part of the k-space corresponding to the second image.

5. The magnetic resonance imaging apparatus according to claim 3, wherein the image generating unit reconstructs an intermediate magnetic resonance image based on the k-space data at the second intervals acquired with respect to the first image, generates k-space data at the first intervals by performing a reverse reconstructing process on the intermediate magnetic resonance image based on the sensitivity distributions, and copies the generated k-space data at the first intervals as the k-space data to be arranged into the peripheral part of the k-space corresponding to the second image.

6. The magnetic resonance imaging apparatus according to claim 1, wherein the image generating unit reconstructs an intermediate magnetic resonance image based on the k-space data at the second intervals and generates the k-space data at the first intervals corresponding to the plurality of channels by performing a reverse reconstructing process on the intermediate magnetic resonance image based on the sensitivity distributions corresponding to the plurality of channels.

7. The magnetic resonance imaging apparatus according to claim 2, wherein the image generating unit reconstructs an intermediate magnetic resonance image based on the k-space data at the second intervals and generates the k-space data at the first intervals corresponding to the plurality of channels by performing a reverse reconstructing process on the intermediate magnetic resonance image based on the sensitivity distributions corresponding to the plurality of channels.

8. The magnetic resonance imaging apparatus according to claim 1, wherein the sequence controlling unit continuously acquires all the magnetic resonance signals to be arranged into the k-space so as to be positioned at the first intervals and so as to be positioned at the second intervals, without any waiting time.

9. The magnetic resonance imaging apparatus according to claim 1, wherein the sequence controlling unit separately acquires magnetic resonance signals to be arranged into the k-space so as to be positioned at the first intervals and magnetic resonance signals to be arranged into the k-space so as to be positioned at the second intervals, with a waiting time between acquisitions.

10. The magnetic resonance imaging apparatus according to claim 1, wherein the sequence controlling unit acquires magnetic resonance signals to be arranged into the k-space so as to be positioned at the first intervals and magnetic resonance signals to be arranged into the k-space so as to be positioned at the second intervals, as a result of acquiring the magnetic resonance signals with a waiting time between acquisitions.

11. The magnetic resonance imaging apparatus according to claim 1, wherein
to acquire magnetic resonance signals to be arranged into the k-space divided into a plurality of segments, the sequence controlling unit acquires the magnetic resonance signals to be arranged into an entire region of the k-space by acquiring, in each of Repetition Times (TRs), magnetic resonance signals corresponding to one or more lines contained in each of the segments from all the segments and repeating such an acquisition over a plurality of TRs, and
the sequence controlling unit acquires the magnetic resonance signals further in such a manner that a quantity of lines acquired from a segment corresponding to a central part of the k-space is larger than a quantity of lines acquired from a segment corresponding to a peripheral part of the k-space.

12. The magnetic resonance imaging apparatus according to claim 1, wherein
the sequence controlling unit acquires, during a first cardiac phase, magnetic resonance signals to be arranged into an entire region of the k-space with a combination of the first intervals and the second intervals and acquires, during a second cardiac phase, magnetic resonance signals to be arranged into a central part of the k-space so as to be positioned at the first intervals, and
to generate an image corresponding to the second cardiac phase, the image generating unit generates k-space data to be arranged into a peripheral part of the k-space based on the k-space data that has been acquired during the first cardiac phase and arranged in the k-space.

13. The magnetic resonance imaging apparatus according to claim 12, wherein, for each heartbeat, the sequence controlling unit repeatedly performs a set of acquisitions including: acquiring, during systole, the magnetic resonance signals to be arranged into the entire region of the k-space with the combination of the first intervals and the second intervals; and acquiring, during diastole, the magnetic resonance signals to be arranged into the central part of the k-space so as to be positioned at the first intervals, before applying a flip back pulse configured to reverse a longitudinal magnetization of a nuclear spin.

14. The magnetic resonance imaging apparatus according to claim 1, wherein
to acquire magnetic resonance signals corresponding to a plurality of cardiac phases while increasing a delay period since a characteristic wave within a predetermined section of a time period from systole to diastole, the sequence controlling unit acquires, with respect to one of the cardiac phases used as a reference, magnetic resonance signals to be arranged into an entire region of the k-space with a combination of the first intervals and the second intervals and acquires, with respect to the other cardiac phases, magnetic resonance signals to be arranged into a central part of the k-space so as to be positioned at the first intervals, and
to generate images corresponding to the cardiac phases, the image generating unit generates k-space data to be arranged into a peripheral part of the k-space based on the k-space data that has been acquired with respect to the cardiac phase used as a reference and arranged in the k-space.

15. The magnetic resonance imaging apparatus according to claim 14, wherein to acquire the magnetic resonance signals to be arranged into the central part of the k-space so as to be positioned at the first intervals with respect to the other cardiac phases, the sequence controlling unit serially acquires magnetic resonance signals corresponding to a plurality of cardiac phases during one heartbeat.

16. The magnetic resonance imaging apparatus according to claim 1, wherein the sequence controlling unit acquires magnetic resonance signals to be arranged into an entire region of the k-space with a combination of the first intervals and the second intervals without applying any labeling pulse to a labeled region and serially acquires, after applying a labeling pulse to the labeled region, magnetic resonance signals to be arranged into a central part of the k-space so as to be positioned at the first intervals, for each elapsed time period while increasing the elapsed time period, and to generate an image obtained by applying the labeling pulse, the image generating unit generates k-space data to be arranged into a peripheral part of the k-space based on the k-space data that has been acquired without applying any labeling pulse and arranged in the k-space.

17. The magnetic resonance imaging apparatus according to claim 1, wherein the sequence controlling unit acquires magnetic resonance signals to be arranged into an entire region of the k-space with a combination of the first intervals and the second intervals without injection of any contrast agent and serially acquires, after a contrast agent is injected, magnetic resonance signals that correspond to a plurality of time phases and are to be arranged into a central part of the k-space so as to be positioned at the first intervals, and to generate an image corresponding to a time after the injection of the contrast agent, the image generating unit generates k-space data to be arranged into a peripheral part of the k-space based on the k-space data that has been acquired without injection of any contrast agent and arranged in the k-space.

18. A magnetic resonance imaging apparatus comprising a memory configured to store therein k-space data and a processor, wherein the processor is configured to:

acquire, by controlling an execution of a pulse sequence, magnetic resonance signals corresponding to a plurality of channels in the pulse sequence executed as a series, the magnetic resonance signals being configured to be arranged into a first region of a k-space so as to be positioned at first intervals and into a second region larger than the first region so as to be positioned at second intervals larger than the first intervals;

arrange the magnetic resonance signals corresponding to the plurality of channels into the k-space as the k-space data; and generate k-space data at the first intervals corresponding to the plurality of channels based on the k-space data at the second intervals acquired by the execution of the pulse sequence and generate a magnetic resonance image based on the generated k-space data at the first intervals, the k-space data at the first intervals acquired by the execution of the pulse sequence, and sensitivity distributions corresponding to the plurality of channels.

19. A magnetic resonance imaging method to be implemented by a magnetic resonance imaging apparatus comprising:

acquiring, by controlling an execution of a pulse sequence, magnetic resonance signals corresponding to a plurality of channels in the pulse sequence executed as a series, the magnetic resonance signals being configured to be arranged into a first region of a k-space so as to be positioned at first intervals and into a second region larger than the first region so as to be positioned at second intervals larger than the first intervals;

arranging the magnetic resonance signals corresponding to the plurality of channels into the k-space as k-space data; and generating k-space data at the first intervals corresponding to the plurality of channels based on the k-space data at the second intervals acquired by the execution of the pulse sequence and generating a magnetic resonance image based on the generated k-space data at the first intervals, the k-space data at the first intervals acquired by the execution of the pulse sequence, and sensitivity distributions corresponding to the plurality of channels.

20. A magnetic resonance imaging apparatus comprising a memory configured to store therein k-space data and a processor, wherein the processor is configured to:

acquire, by controlling an execution of a pulse sequence, magnetic resonance signals corresponding to a plurality of channels in the pulse sequence executed as a series, the magnetic resonance signals being configured to be arranged into a first region of a k-space so as to be positioned at first intervals and into a second region larger than the first region so as to be positioned at second intervals larger than the first intervals;

arrange the magnetic resonance signals corresponding to the plurality of channels into the k-space as the k-space data; and generate a magnetic resonance image based on the k-space data and sensitivity distributions corresponding to the plurality of channels.

\* \* \* \* \*